US010998265B2

(12) United States Patent
Huang et al.

(10) Patent No.: US 10,998,265 B2
(45) Date of Patent: *May 4, 2021

(54) INTERFACE STRUCTURES AND METHODS FOR FORMING SAME

(71) Applicant: INVENSAS BONDING TECHNOLOGIES, INC., San Jose, CA (US)

(72) Inventors: Shaowu Huang, Sunnyvale, CA (US); Javier A. DeLaCruz, Santa Clara, CA (US)

(73) Assignee: Invensas Bonding Technologies, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/600,227

(22) Filed: Oct. 11, 2019

(65) Prior Publication Data
US 2020/0043848 A1 Feb. 6, 2020

Related U.S. Application Data

(63) Continuation of application No. 15/709,309, filed on Sep. 19, 2017, now Pat. No. 10,446,487.
(Continued)

(51) Int. Cl.
*H01L 23/522* (2006.01)
*H01L 23/64* (2006.01)
(Continued)

(52) U.S. Cl.
CPC ...... *H01L 23/5228* (2013.01); *H01L 23/5223* (2013.01); *H01L 23/64* (2013.01);
(Continued)

(58) Field of Classification Search
CPC . H01L 23/5228; H01L 23/5223; H01L 23/64; H01L 23/49811; H01L 24/08; H01L 24/89; H01L 25/0652; H01L 25/18
See application file for complete search history.

(56) References Cited

U.S. PATENT DOCUMENTS 4,998,665 A 3/1991 Hayashi
5,087,585 A 2/1992 Hayashi
(Continued)

FOREIGN PATENT DOCUMENTS

EP 1 441 410 B1 4/2006
JP 2000-100679 4/2000
(Continued)

OTHER PUBLICATIONS

Amirfeiz et al., "Formation of silicon structures by plasma-activated wafer bonding," Journal of The Electrochemical Society, 2000, vol. 147, No. 7, pp. 2693-2698.
(Continued)

*Primary Examiner* — Nathan W Ha
(74) *Attorney, Agent, or Firm* — Knobbe, Martens, Olson & Bear, LLP

(57) ABSTRACT

A stacked and electrically interconnected structure is disclosed. The stacked structure can include a first element comprising a first contact pad and a second element comprising a second contact pad. The first contact pad and the second contact pad can be electrically and mechanically connected to one another by an interface structure. The interface structure can comprise a passive equalization circuit that includes a resistive electrical pathway between the first contact pad and the second contact pad and a capacitive electrical pathway between the first contact pad and the second contact pad. The resistive electrical pathway and the capacitive electrical pathway form an equivalent parallel resistor-capacitor (RC) equalization circuit.

28 Claims, 24 Drawing Sheets

Related U.S. Application Data

(60) Provisional application No. 62/402,913, filed on Sep. 30, 2016.

(51) Int. Cl.
  *H01L 25/065*   (2006.01)
  *H01L 23/00*    (2006.01)
  H01L 25/18      (2006.01)
  H03H 7/06       (2006.01)
  H01L 23/498     (2006.01)

(52) U.S. Cl.
  CPC ............ *H01L 24/08* (2013.01); *H01L 24/89* (2013.01); *H01L 25/0652* (2013.01); *H01L 23/49811* (2013.01); *H01L 25/18* (2013.01); *H01L 2224/0807* (2013.01); *H01L 2224/8034* (2013.01); *H01L 2224/80895* (2013.01); *H01L 2224/80896* (2013.01); *H01L 2224/80986* (2013.01); *H01L 2225/06513* (2013.01); *H01L 2924/1434* (2013.01); *H01L 2924/30101* (2013.01); *H01L 2924/30105* (2013.01); *H03H 7/06* (2013.01)

(56) References Cited

U.S. PATENT DOCUMENTS

| | | |
|---|---|---|
| 5,322,593 A | 6/1994 | Hasegawa et al. |
| 5,408,053 A | 4/1995 | Young |
| 5,471,090 A | 11/1995 | Deutsch et al. |
| 5,753,536 A | 5/1998 | Sugiyama et al. |
| 5,771,555 A | 6/1998 | Eda et al. |
| 5,985,739 A | 11/1999 | Plettner et al. |
| 5,998,808 A | 12/1999 | Matsushita |
| 6,008,126 A | 12/1999 | Leedy |
| 6,080,640 A | 6/2000 | Gardner et al. |
| 6,115,264 A | 9/2000 | Nosaka |
| 6,265,775 B1 | 7/2001 | Seyyedy |
| 6,300,161 B1 | 10/2001 | Goetz et al. |
| 6,374,770 B1 | 4/2002 | Lee |
| 6,418,029 B1 | 7/2002 | McKee et al. |
| 6,423,640 B1 | 7/2002 | Lee et al. |
| 6,465,892 B1 | 10/2002 | Suga |
| 6,638,808 B1 | 10/2003 | Ochi |
| 6,713,871 B2 | 3/2004 | Searls et al. |
| 6,759,692 B1 | 7/2004 | Ochi |
| 6,887,769 B2 | 5/2005 | Kellar et al. |
| 6,908,027 B2 | 6/2005 | Tolchinsky et al. |
| 7,045,453 B2 | 5/2006 | Canaperi et al. |
| 7,078,811 B2 | 7/2006 | Suga |
| 7,105,980 B2 | 9/2006 | Abbott et al. |
| 7,126,212 B2 | 10/2006 | Enquist et al. |
| 7,193,423 B1 | 3/2007 | Dalton et al. |
| 7,339,798 B2 | 3/2008 | Chakravorty |
| 7,354,798 B2 | 4/2008 | Pogge et al. |
| 7,355,836 B2 | 4/2008 | Radhakrishnan et al. |
| 7,705,691 B2 | 4/2010 | Lu et al. |
| 7,741,724 B2 | 6/2010 | Morikawa et al. |
| 7,746,663 B2 | 6/2010 | Hashimoto |
| 7,750,488 B2 | 7/2010 | Patti et al. |
| 7,803,693 B2 | 9/2010 | Trezza |
| 8,009,763 B2 | 8/2011 | Risk et al. |
| 8,130,821 B2 | 3/2012 | Hopkins et al. |
| 8,183,127 B2 | 5/2012 | Patti et al. |
| 8,241,961 B2 | 8/2012 | Kim et al. |
| 8,314,007 B2 | 11/2012 | Vaufredaz |
| 8,349,635 B1 | 1/2013 | Gan et al. |
| 8,357,931 B2 | 1/2013 | Schieck et al. |
| 8,377,798 B2 | 2/2013 | Peng et al. |
| 8,441,131 B2 | 5/2013 | Ryan |
| 8,476,146 B2 | 7/2013 | Chen et al. |
| 8,476,165 B2 | 7/2013 | Trickett et al. |
| 8,482,132 B2 | 7/2013 | Yang et al. |
| 8,483,253 B2 | 7/2013 | Budd et al. |
| 8,501,537 B2 | 8/2013 | Sadaka et al. |
| 8,524,533 B2 | 9/2013 | Tong et al. |
| 8,558,636 B2 | 10/2013 | Shin et al. |
| 8,620,164 B2 | 12/2013 | Heck et al. |
| 8,647,987 B2 | 2/2014 | Yang et al. |
| 8,697,493 B2 | 4/2014 | Sadaka |
| 8,698,323 B2 | 4/2014 | Mohammed et al. |
| 8,716,105 B2 | 5/2014 | Sadaka et al. |
| 8,802,538 B1 | 8/2014 | Liu |
| 8,809,123 B2 | 8/2014 | Liu et al. |
| 8,841,002 B2 | 9/2014 | Tong |
| 8,916,448 B2 | 12/2014 | Cheng et al. |
| 8,988,299 B2 | 3/2015 | Kam et al. |
| 9,093,350 B2 | 7/2015 | Endo et al. |
| 9,142,517 B2 | 9/2015 | Liu |
| 9,171,756 B2 | 10/2015 | Enquist et al. |
| 9,179,584 B2 | 11/2015 | La Porta et al. |
| 9,184,125 B2 | 11/2015 | Enquist et al. |
| 9,224,704 B2 | 12/2015 | Landru |
| 9,230,941 B2 | 1/2016 | Chen et al. |
| 9,257,399 B2 | 2/2016 | Kuang et al. |
| 9,263,186 B2 | 2/2016 | Li et al. |
| 9,299,736 B2 | 3/2016 | Chen et al. |
| 9,312,229 B2 | 4/2016 | Chen et al. |
| 9,331,149 B2 | 5/2016 | Tong et al. |
| 9,337,235 B2 | 5/2016 | Chen et al. |
| 9,368,866 B2 | 6/2016 | Yu |
| 9,385,024 B2 | 7/2016 | Tong et al. |
| 9,391,143 B2 | 7/2016 | Tong et al. |
| 9,394,161 B2 | 7/2016 | Cheng et al. |
| 9,431,368 B2 | 8/2016 | Enquist et al. |
| 9,437,572 B2 | 9/2016 | Chen et al. |
| 9,443,796 B2 | 9/2016 | Chou et al. |
| 9,461,007 B2 | 10/2016 | Chun et al. |
| 9,496,202 B2 | 11/2016 | Hashimoto |
| 9,496,239 B1 | 11/2016 | Edelstein et al. |
| 9,536,848 B2 | 1/2017 | England et al. |
| 9,537,199 B2 | 1/2017 | Dang et al. |
| 9,559,081 B1 | 1/2017 | Lai et al. |
| 9,620,481 B2 | 4/2017 | Edelstein et al. |
| 9,656,852 B2 | 5/2017 | Cheng et al. |
| 9,671,572 B2 | 6/2017 | Decker et al. |
| 9,723,716 B2 | 8/2017 | Meinhold |
| 9,728,521 B2 | 8/2017 | Tsai et al. |
| 9,741,620 B2 | 8/2017 | Uzoh et al. |
| 9,799,587 B2 | 10/2017 | Fujii et al. |
| 9,852,988 B2 | 12/2017 | Enquist et al. |
| 9,881,882 B2 | 1/2018 | Hsu et al. |
| 9,893,004 B2 | 2/2018 | Yazdani |
| 9,929,050 B2 | 3/2018 | Lin |
| 9,941,241 B2 | 4/2018 | Edelstein et al. |
| 9,941,243 B2 | 4/2018 | Kim et al. |
| 9,953,941 B2 | 4/2018 | Enquist |
| 9,960,142 B2 | 5/2018 | Chen et al. |
| 10,002,844 B1 | 6/2018 | Wang et al. |
| 10,026,605 B2 | 7/2018 | Doub et al. |
| 10,075,657 B2 | 9/2018 | Fahim et al. |
| 10,204,893 B2 | 2/2019 | Uzoh et al. |
| 10,269,756 B2 | 4/2019 | Uzoh |
| 10,276,619 B2 | 4/2019 | Kao et al. |
| 10,276,909 B2 | 4/2019 | Huang et al. |
| 10,446,487 B2* | 10/2019 | Huang .................. H01L 24/80 |
| 2002/0000328 A1 | 1/2002 | Motomura et al. |
| 2002/0003307 A1 | 1/2002 | Suga |
| 2002/0131715 A1 | 9/2002 | Brady |
| 2003/0081906 A1 | 5/2003 | Filhaber et al. |
| 2003/0168716 A1* | 9/2003 | Lee ........................ H01L 27/016 |
| | | 257/531 |
| 2004/0084414 A1 | 5/2004 | Sakai et al. |
| 2004/0149991 A1* | 8/2004 | Won ..................... H01L 23/5223 |
| | | 257/68 |
| 2004/0155692 A1 | 8/2004 | Ochi |
| 2004/0207043 A1* | 10/2004 | Matsunaga ............. H01L 28/40 |
| | | 257/534 |
| 2005/0063134 A1* | 3/2005 | Kim ..................... H01L 23/5223 |
| | | 361/301.2 |
| 2005/0135041 A1 | 6/2005 | Kang et al. |
| 2005/0190808 A1 | 9/2005 | Yonekura et al. |
| 2005/0231303 A1 | 10/2005 | Chang et al. |
| 2006/0012966 A1 | 1/2006 | Chakravorty |

(56) References Cited

U.S. PATENT DOCUMENTS

| | | |
|---|---|---|
| 2006/0017144 A1 | 1/2006 | Uematsu et al. |
| 2006/0057945 A1 | 3/2006 | Hsu et al. |
| 2006/0145778 A1 | 7/2006 | Pleva et al. |
| 2007/0045814 A1 | 3/2007 | Yamamoto et al. |
| 2007/0085165 A1* | 4/2007 | Oh .................. H01L 23/5223 257/532 |
| 2007/0096294 A1 | 5/2007 | Ikeda et al. |
| 2007/0111386 A1 | 5/2007 | Kim et al. |
| 2007/0147014 A1 | 6/2007 | Chang et al. |
| 2007/0222048 A1 | 9/2007 | Huang |
| 2007/0295456 A1 | 12/2007 | Gudeman et al. |
| 2008/0124835 A1 | 5/2008 | Chen et al. |
| 2009/0206962 A1 | 8/2009 | Chou et al. |
| 2009/0242252 A1 | 10/2009 | Tanaka |
| 2011/0115579 A1 | 5/2011 | Rofougaran |
| 2011/0290552 A1 | 12/2011 | Palmateer et al. |
| 2012/0013499 A1 | 1/2012 | Hayata |
| 2012/0147516 A1 | 6/2012 | Kim et al. |
| 2012/0168217 A1 | 7/2012 | Hsu et al. |
| 2012/0212384 A1 | 8/2012 | Kam et al. |
| 2013/0009325 A1 | 1/2013 | Mori et al. |
| 2013/0063863 A1 | 3/2013 | Timler et al. |
| 2013/0105943 A1 | 5/2013 | Lai et al. |
| 2013/0207234 A1 | 8/2013 | Ikeda et al. |
| 2013/0265733 A1 | 10/2013 | Herbsommer et al. |
| 2013/0286544 A1 | 10/2013 | Azais |
| 2014/0001568 A1 | 1/2014 | Wang et al. |
| 2014/0048908 A1 | 2/2014 | Chen et al. |
| 2014/0116761 A1 | 5/2014 | Lee et al. |
| 2014/0145338 A1 | 5/2014 | Fujii et al. |
| 2014/0175629 A1 | 6/2014 | Sun et al. |
| 2014/0175655 A1 | 6/2014 | Chen et al. |
| 2014/0177189 A1 | 6/2014 | Liu et al. |
| 2014/0184351 A1 | 7/2014 | Bae et al. |
| 2014/0225795 A1 | 8/2014 | Yu |
| 2014/0252635 A1 | 9/2014 | Tran et al. |
| 2014/0264751 A1 | 9/2014 | Chen et al. |
| 2014/0264948 A1 | 9/2014 | Chou et al. |
| 2014/0370658 A1 | 12/2014 | Tong et al. |
| 2014/0377946 A1 | 12/2014 | Cha et al. |
| 2015/0064498 A1 | 3/2015 | Tong |
| 2015/0097298 A1 | 4/2015 | Chen et al. |
| 2015/0194379 A1 | 7/2015 | Chen et al. |
| 2015/0206902 A1 | 7/2015 | Cheng et al. |
| 2015/0221571 A1 | 8/2015 | Chaparala et al. |
| 2015/0235952 A1 | 8/2015 | Pan et al. |
| 2015/0270209 A1 | 9/2015 | Woychik et al. |
| 2015/0318618 A1 | 11/2015 | Chen et al. |
| 2016/0077294 A1 | 3/2016 | Jou et al. |
| 2016/0111404 A1 | 4/2016 | Sanders et al. |
| 2016/0155677 A1 | 6/2016 | Bonart et al. |
| 2016/0197630 A1 | 7/2016 | Kawasaki |
| 2016/0233195 A1 | 8/2016 | Nagai |
| 2016/0254345 A1 | 9/2016 | Singh et al. |
| 2016/0291265 A1 | 10/2016 | Kinghorn et al. |
| 2016/0309578 A1 | 10/2016 | Park |
| 2016/0343682 A1 | 11/2016 | Kawasaki |
| 2016/0372449 A1 | 12/2016 | Rusu et al. |
| 2017/0019086 A1 | 1/2017 | Dueweke |
| 2017/0062366 A1 | 3/2017 | Enquist |
| 2017/0062409 A1 | 3/2017 | Basker et al. |
| 2017/0179029 A1 | 6/2017 | Enquist et al. |
| 2017/0194271 A1 | 7/2017 | Hsu et al. |
| 2017/0200711 A1 | 7/2017 | Uzoh et al. |
| 2017/0315299 A1 | 11/2017 | Mathai et al. |
| 2017/0338214 A1 | 11/2017 | Uzoh et al. |
| 2017/0343498 A1* | 11/2017 | Kalnitsky .......... H01L 29/78696 |
| 2018/0096931 A1 | 4/2018 | Huang et al. |
| 2018/0174995 A1 | 6/2018 | Wang et al. |
| 2018/0175012 A1 | 6/2018 | Wu et al. |
| 2018/0182639 A1 | 6/2018 | Uzoh et al. |
| 2018/0182666 A1 | 6/2018 | Uzoh et al. |
| 2018/0190580 A1 | 7/2018 | Haba et al. |
| 2018/0190583 A1 | 7/2018 | DeLaCruz et al. |
| 2018/0191047 A1 | 7/2018 | Huang et al. |
| 2018/0219038 A1 | 8/2018 | Gambino et al. |
| 2018/0226375 A1 | 8/2018 | Enquist et al. |
| 2018/0273377 A1 | 9/2018 | Katkar et al. |
| 2018/0286805 A1 | 10/2018 | Huang et al. |
| 2018/0323177 A1 | 11/2018 | Yu et al. |
| 2018/0323227 A1 | 11/2018 | Zhang et al. |
| 2018/0331066 A1 | 11/2018 | Uzoh et al. |
| 2019/0096741 A1 | 3/2019 | Uzoh et al. |
| 2019/0096842 A1 | 3/2019 | Fountain, Jr. et al. |
| 2019/0115277 A1 | 4/2019 | Yu et al. |
| 2019/0131277 A1 | 5/2019 | Yang et al. |
| 2019/0198407 A1 | 6/2019 | Huang et al. |
| 2019/0198409 A1 | 6/2019 | Katkar et al. |
| 2019/0265411 A1 | 8/2019 | Huang et al. |
| 2019/0333550 A1 | 10/2019 | Fisch |
| 2019/0348336 A1 | 11/2019 | Katkar et al. |
| 2019/0385966 A1 | 12/2019 | Gao et al. |
| 2020/0013637 A1 | 1/2020 | Haba |
| 2020/0043817 A1 | 2/2020 | Shen et al. |
| 2020/0075534 A1 | 3/2020 | Gao et al. |
| 2020/0227367 A1 | 7/2020 | Haba et al. |
| 2020/0294908 A1 | 9/2020 | Haba et al. |
| 2020/0328162 A1 | 10/2020 | Haba et al. |
| 2020/0328164 A1 | 10/2020 | DeLaCruz et al. |
| 2020/0328165 A1 | 10/2020 | DeLaCruz et al. |
| 2020/0365575 A1 | 11/2020 | Uzoh et al. |
| 2020/0371154 A1 | 11/2020 | DeLaCruz et al. |

FOREIGN PATENT DOCUMENTS

| | | |
|---|---|---|
| JP | 2001-102479 | 4/2001 |
| JP | 2002-353416 | 12/2002 |
| JP | 2003-043281 | 2/2003 |
| JP | 2008-258258 | 10/2008 |
| JP | 2013-33786 | 2/2013 |
| JP | 2018-160519 | 10/2018 |
| KR | 10-2006-0105797 | 10/2006 |
| KR | 10-2015-0097798 | 8/2015 |
| WO | WO 2005/043584 A2 | 5/2005 |
| WO | WO 2005/064646 A2 | 7/2005 |
| WO | WO 2006/100444 A1 | 9/2006 |
| WO | WO 2012/125237 A2 | 9/2012 |
| WO | WO 2017/15144 | 9/2017 |

OTHER PUBLICATIONS

Chung et al., "Room temperature GaAseu + Si and InPeu + Si wafer direct bonding by the surface activate bonding method," Nuclear Instruments and Methods in Physics Research Section B: Beam Interactions with Materials and Atoms, Jan. 2, 1997, vol. 121, Issues 1-4, pp. 203-206.

Chung et al., "Wafer direct bonding of compound semiconductors and silicon at room temperature by the surface activated bonding method," Applied Surface Science, Jun. 2, 1997, vols. 117-118, pp. 808-812.

Farrens et al., "Chemical free room temperature wafer to wafer direct bonding," J. Electrochem. Soc., The Electrochemical Society, Inc., Nov. 1995, vol. 142, No. 11. pp. 3949-3955.

Farrens et al., "Chemical free wafer bonding of silicon to glass and sapphire," Electrochemical Society Proceedings vol. 95-7, 1995, pp. 72-77.

Gösele et al., "Semiconductor Wafer Bonding: A flexible approach to materials combinations in microelectronics; micromechanics and optoelectronics," IEEE, 1997, pp. 23-32.

Hosoda et al., "Effect of the surface treatment on the room-temperature bonding of Al to Si and SiO2," Journal of Materials Science, Jan. 1, 1998, vol. 33, Issue 1, pp. 253-258.

Hosoda et al., "Room temperature GaAs—Si and InP—Si wafer direct bonding by the surface activated bonding method," Nuclear Inst. And Methods in Physics Research B, 1997, vol. 121, Nos. 1-4, pp. 203-206.

Howlader et al., "A novel method for bonding of ionic wafers," Electronics Components and Technology Conference, 2006, IEEE, pp. 7-pp.

(56) References Cited

OTHER PUBLICATIONS

Howlader et al., "Bonding of p-Si/n-InP wafers through surface activated bonding method at room temperature," Indium Phosphide and Related Materials, 2001, IEEE International Conference on, pp. 272-275.
Howlader et al., "Characterization of the bonding strength and interface current of p-Si/ n-InP wafers bonded by surface activated bonding method at room temperature," Journal of Applied Physics, Mar. 1, 2002, vol. 91, No. 5, pp. 3062-3066.
Howlader et al., "Investigation of the bonding strength and interface current of p-SionGaAs wafers bonded by surface activated bonding at room temperature," J. Vac. Sci. Technol. B 19, Nov./Dec. 2001, pp. 2114-2118.
International Search Report and Written Opinion dated May 29, 2017, issued in International Application No. PCT/US2016/067182, 14 pages.
International Search Report and Written Opinion dated Jan. 9, 2018, issued in International Application No. PCT/US2017/052409, 16 pages.
International Search Report and Written Opinion dated Mar. 22, 2018, issued in International Application No. PCT/US2017/064735, 13 pages.
International Search Report and Written Opinion dated Apr. 23, 2018, issued in International Application No. PCT/US2017/068788, 13 pages.
International Search Report and Written Opinion dated Jul. 17, 2018, issued in International Application No. PCT/US2018/025241, 15 pages.
International Search Report and Written Opinion dated Mar. 7, 2019, in International Application No. PCT/US2018/060044, 14 pages.
International Search Report and Written Opinion dated Apr. 22, 2019 in International Application No. PCT/US2018/064982, 13 pages.
Itoh et al., "Characteristics of fritting contacts utilized for micromachined wafer probe cards," 2000 American Institute of Physics, AIP Review of Scientific Instruments, vol. 71, 2000, pp. 2224.
Itoh et al., "Characteristics of low force contact process for MEMS probe cards," Sensors and Actuators A: Physical, Apr. 1, 2002, vols. 97-98, pp. 462-467.
Itoh et al., "Development of MEMS IC probe card utilizing fritting contact," Initiatives of Precision Engineering at the Beginning of a Millennium: 10th International Conference on Precision Engineering (ICPE) Jul. 18-20, 2001, Yokohama, Japan, 2002, Book Part 1, pp. 314-318.
Itoh et al., "Room temperature vacuum sealing using surface activated bonding method," The 12th International Conference on Solid State Sensors, Actuators and Microsystems, Boston, Jun. 8-12, 2003, 2003 IEEE, pp. 1828-1831.
Jeon, Y. et al., "Design of an on-interposer passive equalizer for high bandwidth memory (HBM) with 30Gbps data transmission," Electronic Components and Technology Conference (ECTC), 2016 IEEE 66th, Aug. 18, 2016.
Ker, Ming-Dou et al., "Fully process-compatible layout design on bond pad to improve wire bond reliability in CMOS Ics," IEEE Transactions on Components and Packaging Technologies, Jun. 2002, vol. 25, No. 2, pp. 309-316.
Kim et al., "Low temperature direct Cu—Cu bonding with low energy ion activation method," Electronic Materials and Packaging, 2001, IEEE, pp. 193-195.
Kim et al., "Room temperature Cu—Cu direct bonding using surface activated bonding method," J. Vac. Sci. Technol., 2003 American Vacuum Society, Mar./Apr. 2003, vol. 21, No. 2, pp. 449-453.
Kim et al., "Wafer-scale activated bonding of Cu—Cu, Cu—Si, and Cu—SiO2 at low temperature," Proceedings—Electrochemical Society, 2003, vol. 19, pp. 239-247.
Kim, H. et al., "A wideband on-interposer passive equalizer design for chip-to-chip 30-Gb/s serial data transmission," IEEE Transactions on Components, Packaging and Manufacturing Technology, Jan. 2015, vol. 5, Issue 1, pp. 28-39.
Lee, H. et al., "Signal integrity of bump-less high-speed through silicon via channel for terabyte/s bandwidth 2.5D IC," 2016 IEEE 66th Electronic Components and Technology Conference, Aug. 18, 2016.
Matsuzawa et al., "Room-temperature interconnection of electroplated Au microbump by means of surface activated bonding method," Electornic Components and Technology Confererence, 2001, 51st Proceedings, IEEE, pp. 384-387.
Moriceau, H. et al., "Overview of recent direct wafer bonding advances and applications," Advances in Natural Sciences-Nanoscience and Nanotechnology, 2010, 11 pages.
Nakanishi, H. et al., "Studies on SiO2—SiO2 bonding with hydrofluoric acid. Room temperature and low stress bonding technique for MEMS," Sensors and Actuators, 2000, vol. 79, pp. 237-244.
Oberhammer, J. et al., "Sealing of adhesive bonded devices on wafer level," Sensors and Actuators A, 2004, vol. 110, No. 1-3, pp. 407-412, see pp. 407-412, and Figures 1(a)-1(I), 6 pages.
Onodera et al., "The effect of prebonding heat treatment on the separability of Au wire from Ag-plated Cu alloy substrate," Electronics Packaging Manufacturing, IEEE Transactions, Jan. 2002, vol. 25, Issue 1, pp. 5-12.
Plobi, A. et al., "Wafer direct bonding: tailoring adhesion between brittle materials," Materials Science and Engineering Review Journal, 1999, R25, 88 pages.
Reiche et al., "The effect of a plasma pretreatment on the Si/Si bonding behaviouir," Electrochemical Society Proceedings, 1998, vol. 97-36, pp. 437-444.
Roberds et al., "Low temperature , in situ, plasma activated wafer bonding," Electrochecmical Society Proceedings, 1997, vol. 97-36, pp. 598-606.
Shigetou et al., "Room temperature bonding of ultra-fine pitch and low-profiled Cu electrodes for bump-less interconnect," 2003 Electronic Components and Technology Conference, pp. 848-852.
Shigetou et al., "Room-temperature direct bonding of CMP—Cu film for bumpless interconnection," Electronic Components and Technology Confererence, 51st Proceedings, 2001, IEEE, pp. 755-760.
Shingo et al., "Design and fabrication of an electrostatically actuated MEMS probe card," Tranducers, Solid-State Sensors, Actuators and Microsystems, 12th International Conference, Jun. 8-12, 2003, vol. 2, pp. 1522-1525.
Suga et al., "A new approach to Cu—Cu direct bump bonding, IEMT/IMC Symposium, 1997, Joint International Electronic Manufacturing Symposium and the International Microelectronics Conference," Apr. 16-18, 1997, IEEE, pp. 146-151.
Suga et al., "A new bumping process using lead-free solder paste," Electronics Packaging Manufacturing, IEEE Transactions on (vol. 25, Issue 4), IEEE, Oct. 2002, pp. 253-256.
Suga et al., "A new wafer-bonder of ultra-high precision using surface activated bonding (SAB) concept," Electronic Components and Technology Conference, 2001, IEEE, pp. 1013-1018.
Suga et al., "Bump-less interconnect for next generation system packaging," Electronic Components and Technology Conference, 2001, IEEE, pp. 1003-1008.
Suga, T., "Feasibility of surface activated bonding for ultra-fine pitch interconnection—A new concept of bump-less direct bonding for system level packaging," The University of Tokyo, Research Center for Science and Technology, 2000 Electronic Components and Technology Conference, 2000 IEEE, pp. 702-705.
Suga, T., "Room-temperature bonding on metals and ceramics," Proceedings of the Second International Symposium on Semiconductor Wafer Bonding: Science, Technology and Applications, The Electrochemical Society Proceedings, vol. 93-29 (1993), pp. 71-80.
Suga et al., "Surface activated bonding—an approach to joining at room temperature," Ceramic Transactions: Structural Ceramics Joining II, The American Ceramic Society, 1993, pp. 323-331.
Suga et al., "Surface activated bonding for new flip chip and bumpless interconnect systems," Electronic Components and Technology Conference, 2002, IEEE, pp. 105-111.

(56) References Cited

OTHER PUBLICATIONS

Suga, "UHV room temperature joining by the surface activated bonding method," Advances in science and technology, Techna, Faenza, Italie, 1999, pp. C1079-C1089.

Takagi et al., "Effect of surface roughness on room-temperature wafer bonding by Ar beam surface activation," Japanese Journal of Applied Physics, 1998, vol. 37, Part 1, No. 1, pp. 4197.

Takagi et al., "Low temperature direct bonding of silicon and silicon dioxide by the surface activation method," Solid State Sensors and Actuators, 1997, Transducers '97 Chicago, 1997 International Conference, vol. 1, pp. 657-660.

Takagi et al., "Room-temperature bonding of lithium niobate and silicon wafers by argon-beam surface activation," Appl. Phys. Lett., 1999. vol. 74, pp. 2387.

Takagi et al., "Room temperature silicon wafer direct bonding in vacuum by Ar beam irradiation," Micro Electro Mehcanical Systems, MEMS '97 Proceedings, 1997, IEEE, pp. 191-196.

Takagi et al., "Room-temperature wafer bonding of Si to LiNbO3, LiTaO3 and Gd3Ga5O12 by Ar-beam surface activation," Journal of Micromechanics and Microengineering, 2001, vol. 11, No. 4, pp. 348.

Takagi et al., "Room-temperature wafer bonding of silicon and lithium niobate by means of arbon-beam surface activation," Integrated Ferroelectrics: An International Journal, 2002, vol. 50, Issue 1, pp. 53-59.

Takagi et al., "Surface activated bonding silicon wafers at room temperature," Appl. Phys. Lett. 68, 2222 (1996).

Takagi et al, "Wafer-scale room-temperature bonding between silicon and ceramic wafers by means of argon-beam surface activation," Micro Electro Mechanical Systems, 2001, MEMS 2001, The 14th IEEE International Conference, Jan. 25, 2001, IEEE, pp. 60-63.

Takagi et al., "Wafer-scale spontaneous bonding of silicon wafers by argon-beam surface activation at room temperature," Sensors and Actuators A: Physical, Jun. 15, 2003, vol. 105, Issue 1, pp. 98-102.

Tong et al., "Low temperature wafer direct bonding, Journal of Microelectomechanical systems," Mar. 1994, vol. 3, No. 1, pp. 29-35.

Topol et al., "Enabling technologies for wafer-level bonding of 3D MEMS and integrated circuit structures," 2004 Electronics Components and Technology Conference, 2004 IEEE, pp. 931-938.

Wang et al., "Reliability and microstructure of Au—Al and Au—Cu direct bonding fabricated by the Surface Activated Bonding," Electronic Components and Technology Conference, 2002, IEEE, pp. 915-919.

Wang et al., "Reliability of Au bump—Cu direct interconnections fabricated by means of surface activated bonding method," Microelectronics Reliability, May 2003, vol. 43, Issue 5, pp. 751-756.

Weldon et al., "Physics and chemistry of silicon wafer bonding investigated by infrared absorption spectroscopy," Journal of Vacuum Science & Technology B, Jul./Aug. 1996, vol. 14, No. 4, pp. 3095-3106.

Westphal, W.B. et al., "Dielectric constant and loss data," Air Force Materials Laboratory, Apr. 1972.

Xu et al., "New Au—Al interconnect technology and its reliability by surface activated bonding," Electronic Packaging Technology Proceedings, Oct. 28-30, 2003, Shanghai, China, pp. 479-483.

Ceramic Microstructures: Control at the Atomic Level, Recent Progress in Surface Activated Bonding, 1998, pp. 385-389.

\* cited by examiner

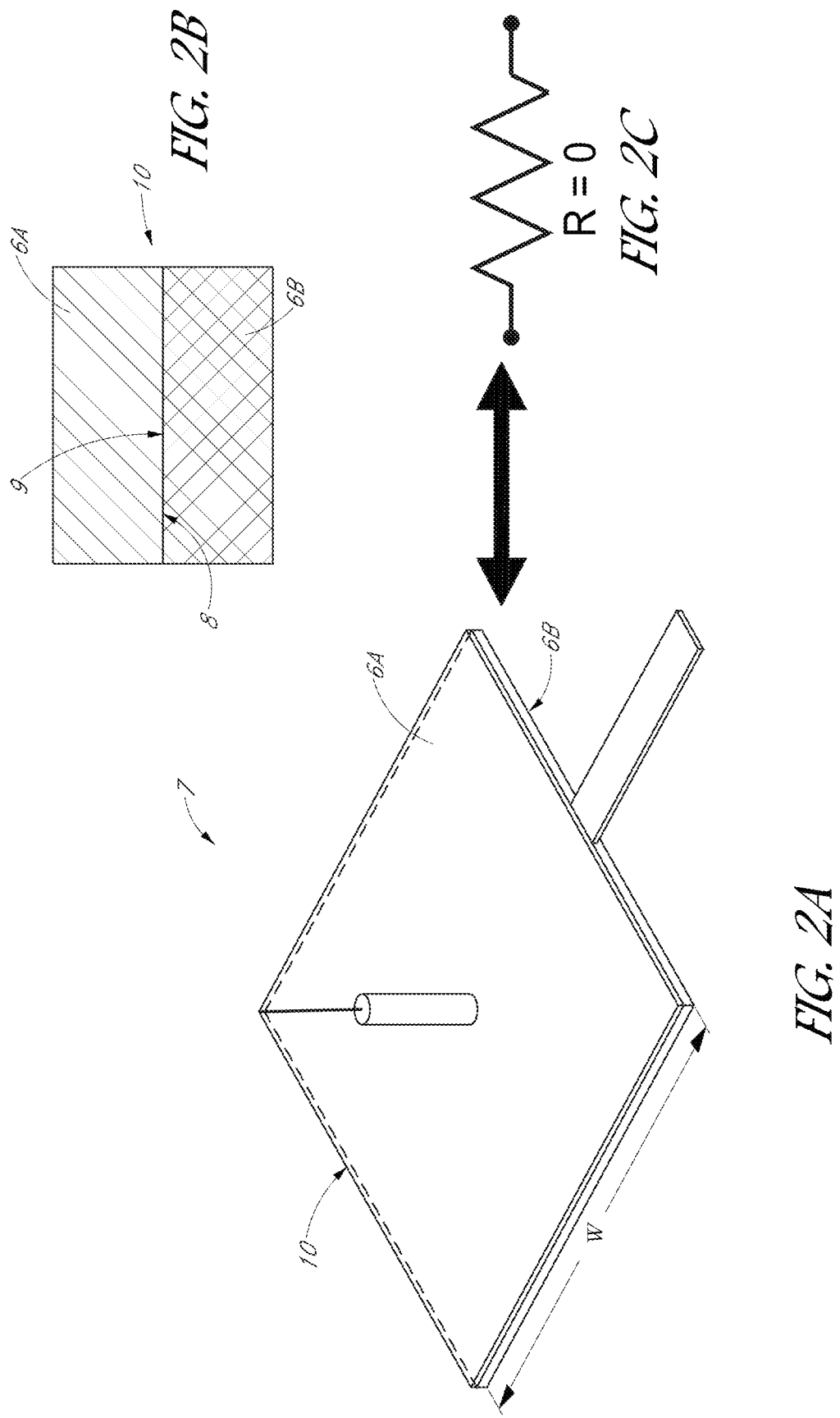

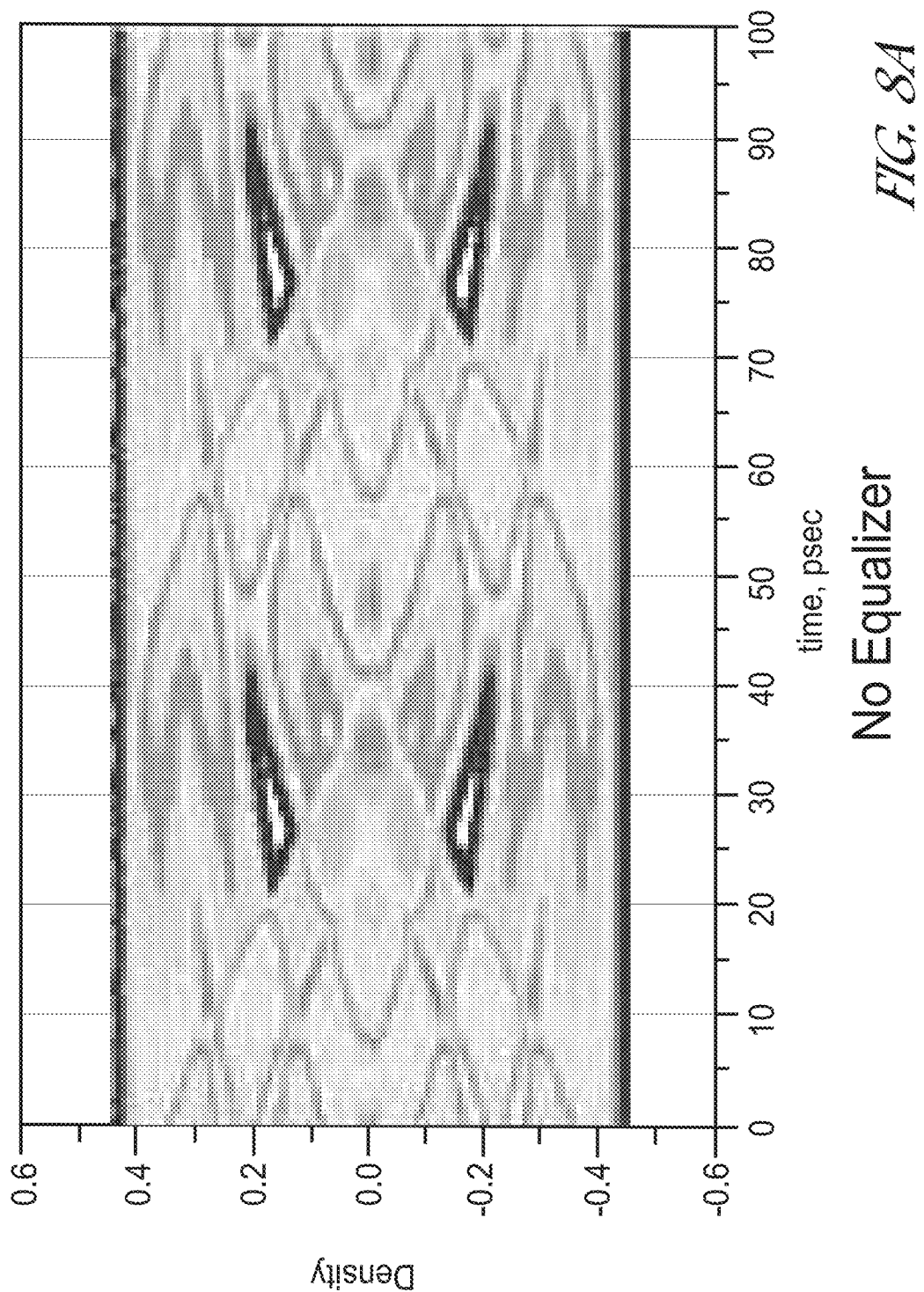
FIG. 8A No Equalizer

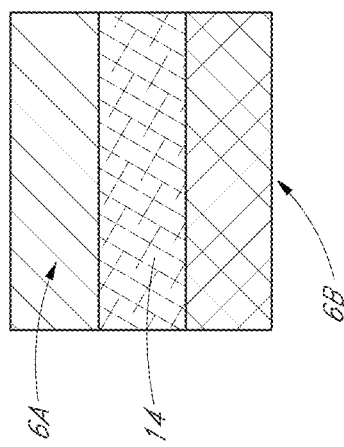
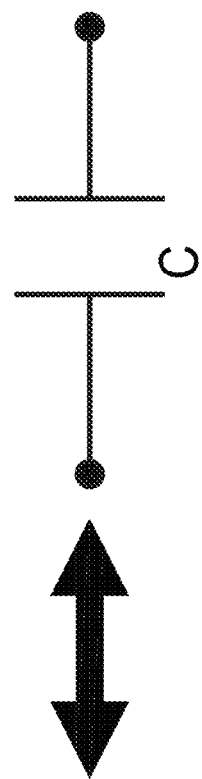
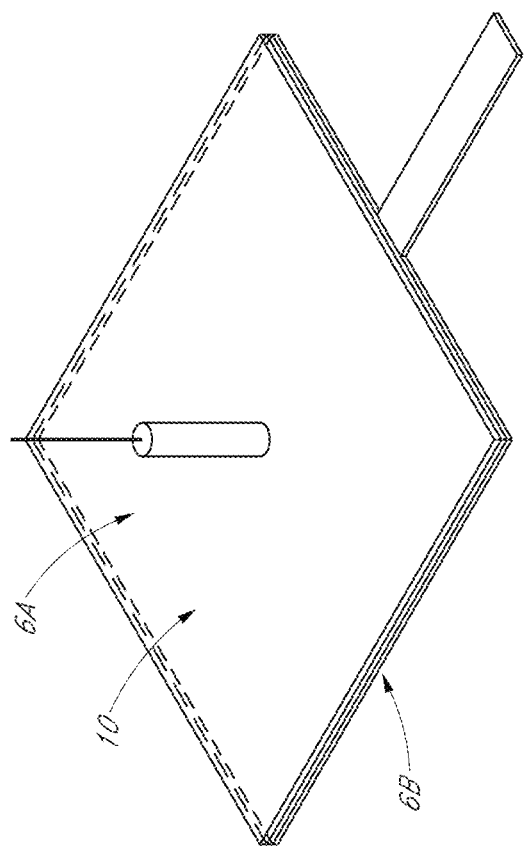
FIG. 11B
FIG. 11C
FIG. 11A

ND METHODS
INTERFACE STRUCTURES AND METHODS
FOR FORMING SAME

BACKGROUND

Field

The field relates to stacked and electrically interconnected structures and methods for forming same. In particular, the field relates to elements (such as semiconductor dies) that are connected with an interface structure that defines one or more passive electronic components, such as an equalization circuit.

Description of the Related Art

Passive electronic components can be important at the system board level, at the package level, and/or at the device chip level. In various systems, passive components can be used to achieve signal and/or power integrity of the larger electronic system. For example, various electronic systems may experience frequency-dependent signal losses, e.g., when signals are transferred from one component to another. For example, various high-speed signaling devices (such as high bandwidth memory devices) may utilize an interposer to transfer signals between a memory die (or a stack of memory dies) and one or more corresponding processor dies. Depending on the operation speed and the channel length, the signals along each channel may degrade due to frequency-dependent losses, or otherwise lose signal integrity, based at least in part on the distance the signal travels and/or the materials used to electrically connect the memory die(s) with the processor die(s).

Accordingly, there remains a continuing need for improved incorporation of electrical components such as passive components into electronic systems or packages.

BRIEF DESCRIPTION OF THE DRAWINGS

FIG. 2A is a schematic perspective view of a portion of a stacked structure having an interface structure between two contact pads of different semiconductor elements, where the interface structure electrically and mechanically connects the two semiconductor elements.

FIG. 2B is a schematic side sectional view of the interface structure shown in FIG. 2A.

FIG. 2C is a schematic diagram of an electrical model of the stacked interconnect structure of FIGS. 2A-2B.

FIGS. 8A-8D illustrate plots of eye diagrams for various stacked and electrically interconnected structures with different effective dielectric constants.

FIG. 11A is a schematic perspective view of a portion of a stacked structure having an interface structure that electrically and mechanically connects two semiconductor elements, with the remainder of the semiconductor elements omitted (including other contact pads that may be similarly configured) for ease of illustration.

FIG. 11B is a schematic side sectional view of the interface structure shown in FIG. 11A.

FIG. 11C is a schematic diagram of an electrical model of the interface structure of FIGS. 11A-11B.

DETAILED DESCRIPTION

Figure 1A:
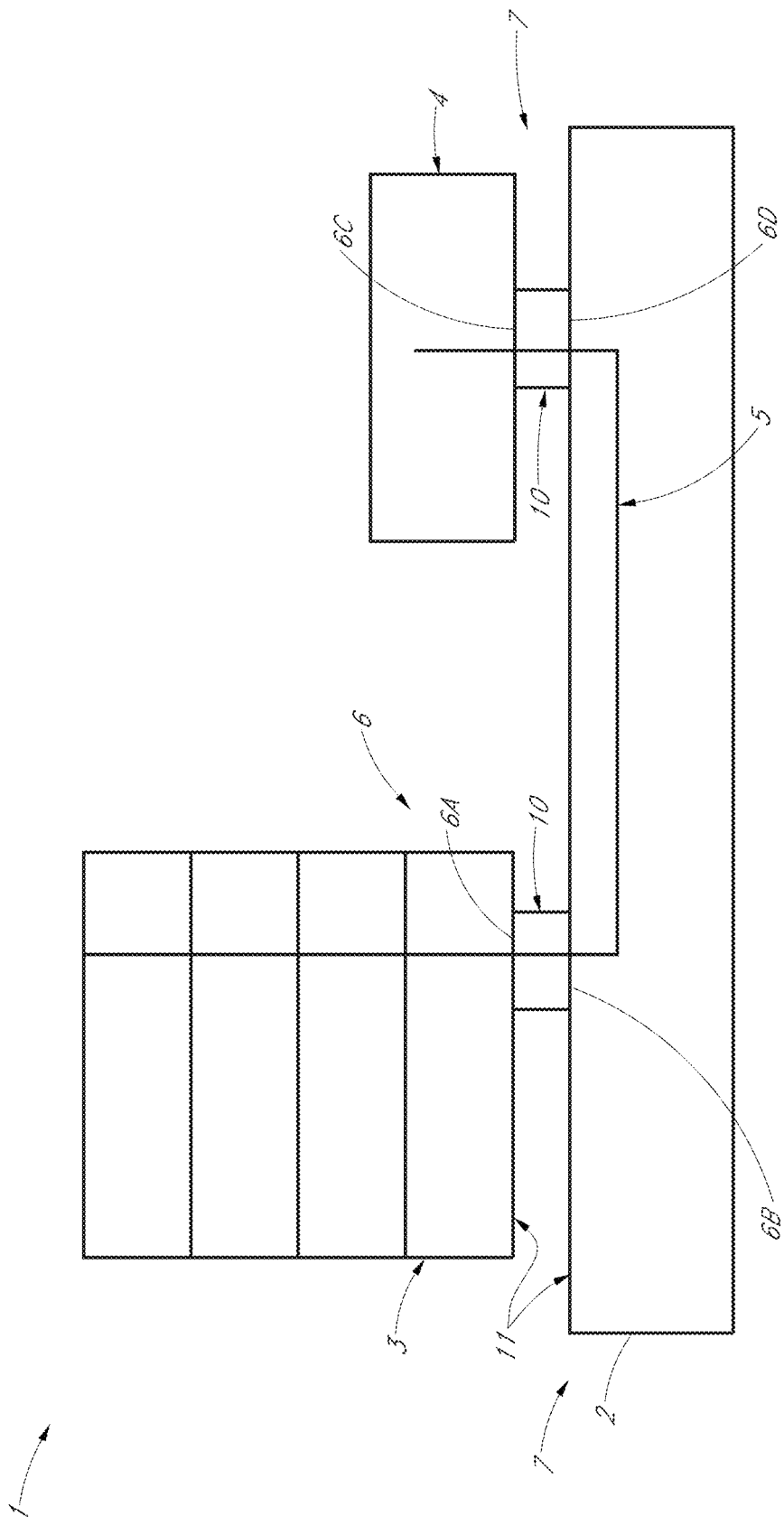
FIG. 1A is a schematic side view of a device that includes stacked and electrically interconnected structures according to various embodiments.

Various embodiments disclosed herein relate to the incorporation of one or more electronic components, particularly passive components, on an element, such as a semiconductor element, by way of direct bonding without an intervening adhesive. For example, in some embodiments, two semiconductor elements can be patterned with conductive and non-conductive features such that, when the two semiconductor elements are bonded together (e.g., by way of direct bonds), the corresponding patterns mate to define one or a plurality of passive components between the bonded semiconductor elements. Beneficially, therefore, the embodiments disclosed herein can integrate electronic components, and particularly passive components (such as resistors, capacitors, inductors, or combinations thereof), into the bonded interface structure between the two semiconductor elements. While examples are provided for bonding semiconductor elements, the skilled artisan will appreciate that the principles and advantages taught herein are applicable to the bonding of other electronic circuit or device elements that may or may not include semiconductor materials. The integration of passive components into the interface region can advantageously enable smaller devices and/or packages, since the passive components need not be separately provided on the device die or on the package substrate. Rather, the passive components can be integrated with the mechanical and/or electrical connections formed along the bonded interface.

In some embodiments, as explained herein, each of the two elements to be bonded can be defined with corresponding patterns, and the passive components can be defined along the bonded interface of the two elements. In some embodiments, the passive components can be defined in layers formed on one of the elements, and the one element can be bonded to the other element in any suitable manner, e.g., by direct bonding, or with an adhesive. In other embodiments, the passive components can be defined partially by layers formed on one element and partially in layers formed on another element, which layers can be bonded (e.g., direct bonded or bonded with an adhesive) to one another.

For example, various embodiments disclosed herein relate to a passive component comprising a passive equalizer that can be defined by an interface structure that electrically connects corresponding contact pads of two elements. In various high speed signaling devices, signal integrity may be appreciably reduced when signals are transferred over lossy channels. For example, in high bandwidth memory (HBM) devices, multiple parallel signals may be transferred along multiple channels from a stack of memory dies to one or more corresponding processors by way of an interposer. The length of the lossy conductive pathways, the materials selected for the elements and conductors, and/or interference from other, nearby signal pathways may degrade the integrity of signals transferred along the channels.

In some systems, active equalizers may be used to maintain signal integrity in integrated device systems. Such active equalizers may include processing electronics that are actively powered so as to compensate for frequency-dependent signal losses. However, powering active equalizers may be undesirable due to the increased power requirements. Moreover, active equalizers may utilize complex components that can undesirably increase the complexity and/or cost of the system. In other systems, discrete passive equalizers can be mounted to the board or to the package to compensate for signal losses. However, the relatively large dimension of board-mounted or package-mounted passive equalizers makes it challenging to incorporate conventional passive equalizers at the system- or package-level, in particular for highly parallel interfaces like HBM that have thousands of signal links that need thousands of equalizers. Further, the use of discrete board-mounted or package-mounted equalizers can occupy device- or package-level space that could otherwise be used for other features.

Various embodiments disclosed herein can advantageously incorporate an equalizer into the electrical interface between two connected elements, such as integrated circuit (IC) dies or interposers. For example, in some embodiments, the equalization circuit can be integrally formed with the mechanical and electrical interface between two connected elements, e.g., between at least two stacked and electrically interconnected semiconductor elements. The equalization circuit can be configured so as to adjust a frequency response of the stacked and electrically interconnected structure. In some embodiments, a stacked and electrically interconnected structure can include a first element comprising a first contact pad and a second element comprising a second contact pad. The first contact pad and the second contact pad can be electrically and mechanically connected to one another by an interface structure. The interface structure can be disposed between the first and second contact pads. In some embodiments, the interface structure can include the first and second contact pads (e.g. the contact pads can act as terminals in a capacitive pathway). The interface structure can comprise a passive equalization circuit that includes a resistive electrical pathway between the first contact pad and the second contact pad and a capacitive electrical pathway between the first contact pad and the second contact pad. For example, in some embodiments, the interface structure can comprise a first conductive interface between the first contact pad and the second contact pad, and a second dielectric interface between the first contact pad and the second contact pad. Beneficially, the capacitive and resistive electrical pathways of the passive equalization circuit can be integrated in a parallel manner into the electrical interface between the two elements, which can free up space on the package substrate, interposer, or system board that would otherwise be used for conventional passive or active equalizers. For the capacitive electrical pathway between the elements, the contact pads can act as the electrodes or terminals of the capacitor, with an intervening dielectric disposed therebetween.

FIG. 1A is a schematic side view of a device 1 that includes stacked and electrically interconnected structures 7 (also referred to herein as stacked structures) according to various embodiments. As shown in FIG. 1A, the device 1 can include an interposer 2 (e.g., a first semiconductor element) to which a first device die 3 (e.g., a second semiconductor element) and a second device die 4 (e.g., a third semiconductor element) are mounted. In the embodiment of FIG. 1A, the first device die 3 comprises a stack of one or more memory dies, and the second device die 4 comprises one or more corresponding processor dies. In some embodiments, the first device die 3 can comprise a communications die. The interposer 2 can comprise a carrier (such as a silicon substrate) with conductive traces defined therein to route signals among the device dies 3, 4 and the interposer 2. Although the first and second device dies 3, 4 are illustrated as being mounted to an interposer 2, it should be appreciated that any other suitable type of semiconductor element can be used for the first and second dies 3, 4 and/or for the interposer 2. For example, in some embodiments, the interposer 2 can instead be another integrated device die (such as a memory die or a processor die).

As shown in FIG. 1A, the interposer 2 can comprise one or more channels 5 that include one or more corresponding signal pathways between the first die 3 and the second die 4. The first die 3 can be mechanically and electrically connected to the interposer 2 by way of an interface structure 10 that mechanically and electrically connects corresponding contact pads 6 of the first die 3 and the interposer 2. For example, the first die 3 can comprise a first contact pad 6A, and the interposer 2 can comprise a second contact pad 6B. The contact pads 6A, 6B may be conventionally formed at the active surfaces of the dies or may be part of through-silicon via (TSV) structures. The contact pads 6A, 6B can be surrounded by a non-conductive field region 11, in various embodiments. The interface structure 10 can provide electrical communication between the corresponding contact pads 6A, 6B. Similarly, the second die 4 can comprise a third contact pad 6C, and the interposer 2 can comprise a fourth contact pad 6D. Another interface structure 10 can provide electrical communication between the corresponding contact pads 6C, 6D. The one or more channels 5 can be routed between the first contact pad 6A of the first die 3 and the third contact pad 6C of the second die 4 to provide communication between the first and second dies 3, 4 by way of the interposer 2. Although only one channel 5 is illustrated in FIG. 1A, it should be appreciated that a plurality of channels 5 may be provided between a corresponding plurality of contact pads 6 defined in the first die 3, the interposer 2, and the second die 4.

Figure 1B:
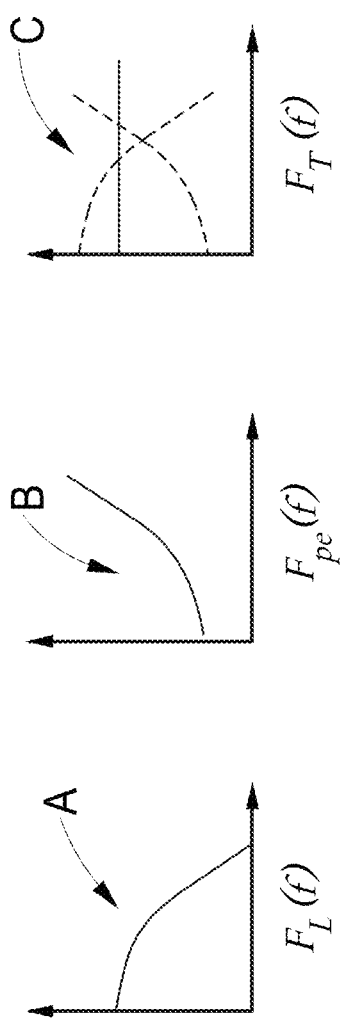
FIG. 1B is a schematic diagram illustrating the use of a passive equalizer to compensate for a lossy channel.

As explained above, the one or more channels 5 may experience a loss of signal integrity based on, e.g., the length of the channel(s) 5, the materials used in the semiconductor elements, and/or the proximity of other electrical signal lines that may introduce electrical interference. FIG. 1B is a schematic diagram illustrating the use of a passive equalizer to compensate for a lossy channel 5. As shown in FIG. 1B, a lossy channel can be modeled with a transfer function $F_L(f)$, which is plotted in Chart A. An ideal passive equalizer can be modeled with a transfer function $F_{pe}(f)$, which is plotted in Chart B. A transfer function $F_T(f)$ of the compensated channel can be modeled based on a multiplication of $F_L(f)$ with $F_{pe}(f)$. Chart C illustrates a plot of $F_T(f)$. As shown in FIG. 1B, the gain of the system may decrease significantly at higher frequencies, which results in a lossy electrical channel. Incorporating an equalizer can beneficially reduce the degree of signal losses, as shown in Chart C. As explained herein, the disclosed embodiments can beneficially incorporate a passive equalizer into the electrical interface that directly electrically connects two stacked semiconductor elements.

Figure 1C:
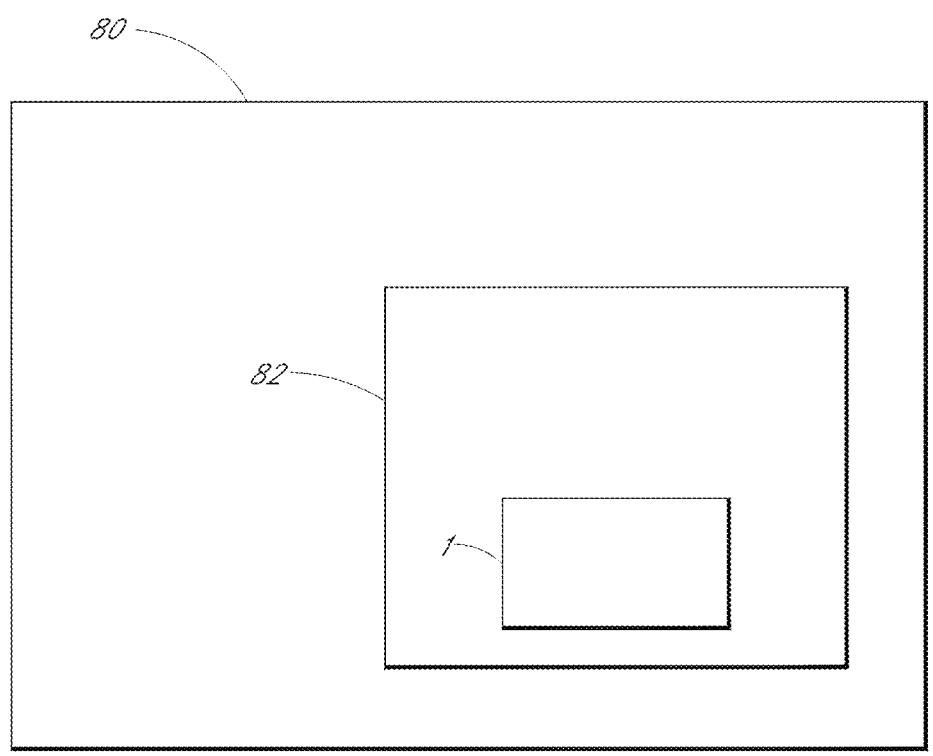
FIG. 1C is a schematic diagram of an electronic system incorporating one or more devices with stacked and electrically interconnected structures, according to various embodiments.

FIG. 1C is a schematic diagram of an electronic system 80 incorporating one or more devices 1 with stacked and electrically interconnected structures, according to various embodiments. The system 80 can comprise any suitable type of electronic device, such as a mobile electronic device (e.g., a smartphone, a tablet computing device, a laptop computer, etc.), a desktop computer, an automobile or components thereof, a stereo system, a medical device, a camera, or any other suitable type of system. In some embodiments, the electronic system 80 can comprise a microprocessor, a graphics processor, an electronic recording device, or digital memory. The system 80 can include one or more device packages 82 which are mechanically and electrically connected to the system 80, e.g., by way of one or more motherboards. Each package 82 can comprise one or more devices 1. The system 80 shown in FIG. 1C can comprise any of the stacked structures 7 shown and described herein.

FIG. 2A is a schematic perspective view of a portion of a stacked structure 7 having an interface structure 10 that electrically and mechanically connects two semiconductor elements, with the remainder of the semiconductor elements omitted (including other contact pads that may be similarly configured) for ease of illustration. FIG. 2B is a schematic side sectional view of the interface structure 10 shown in FIG. 2A. FIG. 2C is a schematic diagram of an electrical model of the interface structure 10 of FIGS. 2A-2B. Although not illustrated in FIGS. 2A-2B for ease of illustration, it should be appreciated that the contact pads 6A, 6B may be exposed at exterior surfaces of associated semiconductor elements, such as any one of the first die 2, the second die 3, and/or the interposer 2. The interface structure 10 illustrated herein can define one or more passive components between two semiconductor elements. In the illustrated embodiment, as explained herein, the passive component(s) can comprise a passive equalization circuit. In other embodiments, however, the passive component(s) can comprise any other suitable type of passive electronic component, such as resistors, capacitors, inductors, and any suitable combinations thereof. Furthermore, although the embodiment of FIGS. 2A-2C is described in connection with semiconductor elements and device dies, it should be appreciated that other types of elements (e.g., optical elements, electronic elements or other elements that may or may not comprise a semiconductor material) may be used in conjunction with the disclosed embodiments. In various embodiments, one element may comprise a semiconductor element and the other element may comprise a different type of element, e.g., an optical element or device.

The interface structure 10 shown in FIGS. 2A-2B comprises a conductive connection between the first contact pad 6A and the second contact pad 6B. For example, as shown in FIG. 2B, the contact pad 6A can be directly electrically connected to the contact pad 6B to provide only a conductive interconnection between the contact pads 6A, 6B. As shown in FIG. 2C, the interconnect structure 10 can therefore be modeled electrically as a resistor R. For contact pads 6A, 6B that have very low resistance, the resistance may be approximated to be zero. In other arrangements, the resistance between the contact pads 6A, 6B may be greater than zero. This may be true whether the direct connection is a direct bond between the contact pads 6A, 6B, without intervening adhesive elements, or there are intervening conductive features, such as solder.

For example, in some arrangements, the contact pads 6A, 6B can comprise a metal or metal alloy, e.g., copper, aluminum, etc. The contact pads 6A, 6B can have a major dimension d (e.g., a width) in a range of 5 microns to 150 microns, in a range of 10 microns to 150 microns, in a range of 25 microns to 150 microns, in a range of 25 microns to 120 microns, in a range of 30 microns to 120 microns, in a range of 30 microns to 100 microns, in a range of 40 microns to 100 microns, in a range of 50 microns to 100 microns, in a range of 50 microns to 90 microns, or in a range of 50 microns to 80 microns in various embodiments. The contact pads 6A, 6B can be polygonal (e.g., rectangular or square) as shown in FIG. 2A, rounded (e.g., circular, elliptical, etc.), or any other suitable shape. Although the major dimension d shown in FIG. 2A is considered a major dimension of the rectangular contact pads shown in FIG. 2A, for other polygonal shapes, the major dimension can be defined as the longest side of the polygonal shape. For rounded shapes, the major dimension can be defined as the major axis of the rounded shape (e.g., a major axis of an ellipse or a diameter of a circle).

The contact pads 6A, 6B of the associated semiconductor elements can be directly electrically connected in a variety of ways. In the illustrated embodiment, and indeed for each of the embodiments disclosed herein, the direct electrical connection of the interface structure 10 can be defined by a direct bond between the contact pads 6A, 6B, without an intervening adhesive, without being limited thereto. In some embodiments, the contact pads 6A, 6B may be surrounded by non-conductive field regions 11 of the respective semiconductor elements (e.g., the dies 3, 4 and/or the interposer 2) (see FIG. 1A). To accomplish the direct bonding, in some embodiments, respective bonding surfaces 8, 9 of the contact pads 6A, 6B and the non-conductive field regions 11 can be prepared for bonding. The bonding surfaces 8, 9 of the contact pads 6A, 6B (and non-conductive field regions 11) can be polished to a very high degree of smoothness (e.g., less than 20 nm surface roughness, or more particularly, less than 5 nm surface roughness). In some embodiments, the surfaces to be bonded may be terminated with a suitable species and activated prior to bonding. For example, in some embodiments, the non-conductive surfaces (e.g., field regions 11) to be bonded may be very lightly etched for activation and exposed to a nitrogen-containing solution and terminated with a nitrogen-containing species. As one example, the surfaces to be bonded (e.g., field regions 11) may be exposed to an ammonia dip after a very slight etch, and/or a nitrogen-containing plasma (with or without a separate etch).

In some embodiments, the contact pads 6A, 6B can be flush with the exterior surfaces (e.g., the field regions 11) of the respective semiconductor elements. In other embodiments, the contact pads 6A, 6B may extend above the exterior surfaces (e.g., the field regions 11) of the respective semiconductor elements. In still other embodiments, the contact pads 6A, 6B are recessed relative to the exterior surfaces (e.g., field regions 11) of the respective semiconductor elements.

Once the respective surfaces are prepared, the nonconductive field regions 11 of one semiconductor element can be brought into contact with corresponding nonconductive regions 11 of the other semiconductor element. The interaction of the activated surfaces can cause the nonconductive regions 11 of one semiconductor element to directly bond with the corresponding nonconductive regions 11 of the other semiconductor element without an intervening adhesive, without application of external pressure, without application of voltage, and at room temperature. In various embodiments, the bonding forces of the nonconductive regions 11 can include covalent bonds that are greater than Van der Waals bonds and exert significant forces between the contact pads 6A, 6B. Regardless of whether the contact pads are flush with the nonconductive regions, recessed or protrude, direct bonding of the nonconductive regions 11 can facilitate direct metal-to-metal bonding between the contact pads 6A, 6B. In various embodiments, the semiconductor elements may be heated after bonding to strengthen the bonds between the nonconductive regions 11, between the conductive regions (e.g., the contact pads 6A, 6B), and/or between opposing conductive and non-conductive regions, to cause semiconductor elements to bond to one another, to form a direct electrical and mechanical connection.

Additional details of the direct bonding processes used in conjunction with each of the disclosed embodiments may be found throughout U.S. Pat. Nos. 7,126,212; 8,153,505; 7,622,324; 7,602,070; 8,163,373; 8,389,378; and 8,735,219, and throughout U.S. patent application Ser. Nos. 14/835,379; 62/278,354; 62/303,930; and 15/137,930, the contents of each of which are hereby incorporated by reference herein in their entirety and for all purposes.

In other embodiments, however, the semiconductor elements (e.g., the first die 3 and the interposer 2) can be directly electrically connected using a conductive adhesive. For example, in such other embodiments, the contact pads 6A, 6B can be connected together using a conductive epoxy, solder, or any other suitable conductive adhesive. Unlike embodiments that employ direct bonding without an intervening adhesive, in other embodiments, the conductive pathway (modeled by the resistor of FIG. 2C) may be defined by the contact pads 6A, 6B and the intervening conductive adhesive.

The interface structure 10 of FIGS. 2A-2C may be relatively lossy, such that signal integrity decreases at various operating frequencies. Without being limited by theory, utilizing only a conductive, low resistance electrical pathway may result in frequency-dependent signal losses that negatively affect the overall performance of the system.

To address the aforementioned lossy channels, various embodiments disclosed herein can incorporate a passive equalizer into the interface structure that connects two semiconductor elements. As explained herein, the integrated passive equalizer can include a resistive electrical pathway in parallel with a capacitive electrical pathway, which can beneficially mitigate signal depreciation and improve the performance of the system.

Figure 3C:
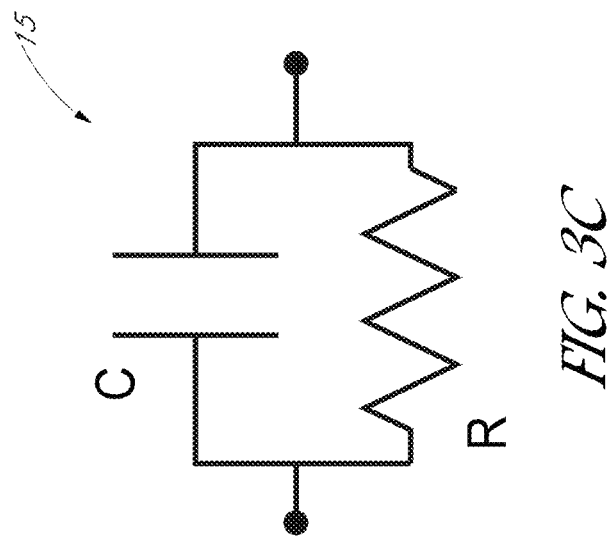
FIG. 3C is a schematic diagram of an electrical model of the interface structure of FIGS. 3A-3B.
Figure 3A:
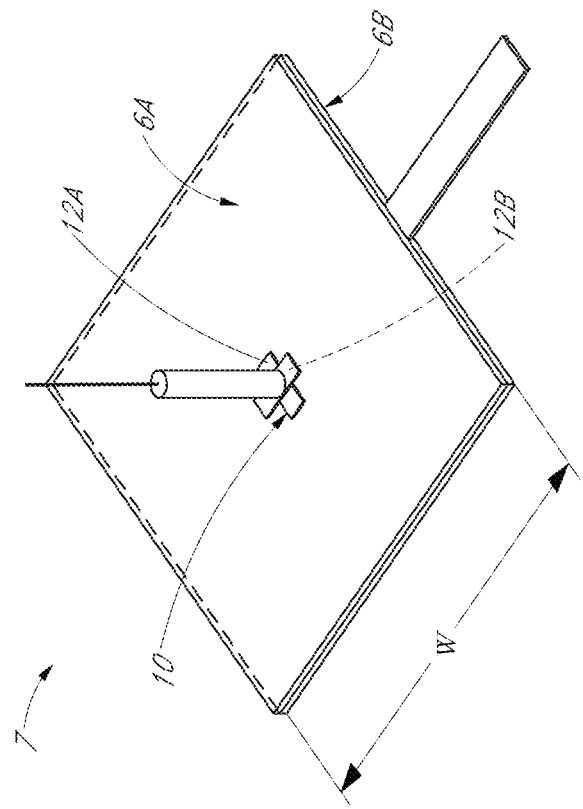
FIG. 3A is a schematic perspective view of a portion of a stacked and electrically interconnected structure having an interface structure between two contact pads of different semiconductor elements, where the interface structure electrically and mechanically connects the two semiconductor elements, in accordance with various embodiments.
Figure 3B:
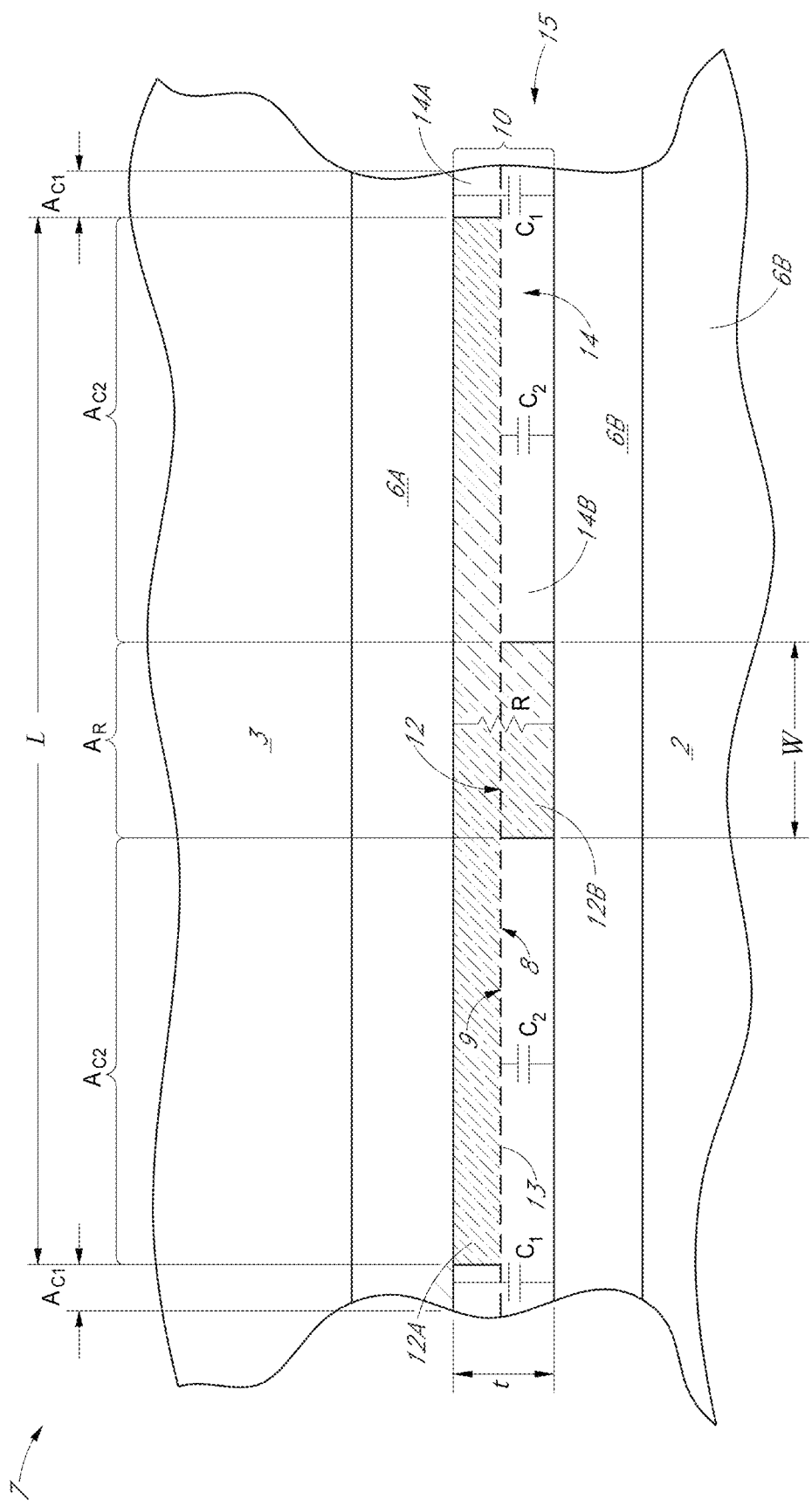
FIG. 3B is a schematic side sectional view of the interface structure shown in FIG. 3A.

FIGS. 3A-3E illustrate one embodiment of a portion of a stacked and electrically interconnected structure 7 that includes a passive electronic component defined between two bonded semiconductor elements. In FIGS. 3A-3E, the passive component comprises an integrated passive equalizer. FIG. 3A is a schematic perspective view of the portion of the stacked structure 7 having an interface structure 10 that electrically and mechanically connects two semiconductor elements (not shown in FIG. 3A), in accordance with various embodiments. FIG. 3B is a schematic side sectional view of the interface structure 10 shown in FIG. 3A. FIG. 3C is a schematic diagram of an electrical model of the interface structure 10 of FIGS. 3A-3B. Unless otherwise noted, reference numerals in FIGS. 3A-3E represent components that are the same as or similar to like-numbered components of FIGS. 2A-2C. As with FIG. 2A, the remainder of the semiconductor elements (such as the dies 3, 4, and interposer 2) have been omitted from FIGS. 3A and 3D-3E for ease of illustration. The semiconductor elements are illustrated in FIG. 3B, for example, as the first die 3 and the interposer 2. Also, although the embodiment of FIGS. 3A-3E is described in connection with semiconductor elements, it should be appreciated that other types of elements (e.g., optical elements, electronic elements or other elements that may or may not comprise a semiconductor material) may be used in conjunction with the disclosed embodiments.

As with FIGS. 2A-2C, the embodiment of FIGS. 3A-3E includes a first contact pad 6A that is directly electrically and mechanically connected with a second contact pad 6B. As explained above, the contact pads 6A, 6B may be exposed at exterior surfaces of associated semiconductor elements, such as any one of the first die 2, the second die 3, and/or the interposer 2. Further, the contact pads 6A, 6B can comprise a metal or metal alloy, e.g., copper, aluminum, etc. and can include surface layers, such as barrier layers (e.g., a metal nitride barrier material, such as a titanium nitride barrier material). The contact pads 6A, 6B can have a major dimension d (e.g., a width) in a range of 5 microns to 150 microns, in a range of 10 microns to 150 microns, in a range of 25 microns to 150 microns, in a range of 25 microns to 120 microns, in a range of 30 microns to 120 microns, in a range of 30 microns to 100 microns, in a range of 40 microns to 100 microns, in a range of 50 microns to 100 microns, in a range of 50 microns to 90 microns, or in a range of 50 microns to 80 microns in various embodiments. The contact pads 6A, 6B can be polygonal (e.g., rectangular or square) as shown in FIG. 3A, rounded (e.g., circular, elliptical, etc.), or any other suitable shape.

Unlike the arrangement shown in FIGS. 2A-2C, however, in FIGS. 3A-3E, the stacked structure 7 can comprise a passive equalizer 15 integrated into the interface structure 10. Beneficially, the integration of the passive equalizer 15 into the interface structure 10 can reduce the size of the device 1, since board and/or package space can be utilized for other functions and/or devices. As shown in FIG. 3C, the passive equalizer 15 can be modeled as an RC circuit with a resistor R in parallel with a capacitor C. The equalizer 15 can improve the frequency-dependent performance of the device 1 while reducing the overall size of the device 1. In other embodiments, the passive equalizer 15 can comprise other non-RC types of passive equalizers, such as a series resistor-inductor (RL) passive equalizer, or a resistor-inductor-capacitor (RLC) equalizer.

As illustrated in FIG. 3B, the passive equalizer 15 (integrated into the interface structure 10) can include a conductive interface feature 12 between the first contact pad 6A and the second contact pad 6B, and a dielectric interface feature 14 between the first contact pad 6A and the second contact pad 6B. In the illustrated embodiment, the conductive interface feature 12 can include a first conductive interface feature 12A deposited on or otherwise coupled with the first contact pad 6A, and a second conductive interface feature 12B deposited on or otherwise coupled with the second contact pad 6B. The dielectric interface feature 14 can comprise a first dielectric interface feature 14A deposited on or otherwise coupled with the first contact pad 6A, and a second dielectric interface feature 14B deposited on or otherwise coupled with the second contact pad 6B. In the illustrated embodiment, the first and second dielectric interface features 14A, 14B can be disposed about and/or surround the respective first and second conductive interface features 12A, 12B.

The conductive and dielectric interface features 12, 14 can be deposited on the respective contact pads 6 in various embodiments, e.g., by way of any suitable deposition process (such as atomic layer deposition, chemical vapor deposition, spin coating, etc.). In other embodiments, however, the conductive and dielectric interface features 12, 14 can be adhered or laminated onto the contact pads 6. In still other embodiments, the first and second conductive interface features 12A, 12B and the first and second dielectric interface features 14A, 14B can be coupled with only one of the contact pads 6A, 6B.

The conductive interface features 12A, 12B can comprise any suitable conductive material such as copper or aluminum. The top and/or bottom surfaces of the interface features 12A, 12B can comprise barrier layers with non-negligible resistance. For example, in some embodiments, the top and/or bottom surfaces of the conductive interface features 12A, 12B can comprise a metal nitride material, such as titanium nitride, tantalum nitride, or tantalum nitride composite materials. In some embodiments, additional metals (such as additional copper and/or aluminum layers) may be deposited on top of or underneath the barrier layer(s). In other embodiments, the conductive interface features 12A, 12B can comprise a metal such as copper or aluminum, and may comprise one or more barrier layers (e.g., titanium nitride or tantalum nitride) applied over the metal. Still other conductive materials may be used. Moreover, in some embodiments, each feature 12A, 12B can be defined by multiple conductive layers. Beneficially, in various embodiments, the conductive interface features 12A, 12B with the barrier layers may have a non-negligible resistance so as to improve the performance of the passive equalizer 15. For example, in some embodiments, the conductive interface features 12A, 12B with the barrier layers can have an overall or equivalent resistance (modeled as R in FIG. 3C) in a range of 10Ω to 200Ω, in a range of 10Ω to 100Ω, or in a range of 20Ω to 70Ω (e.g., about 50Ω). The material used for the conductive interface features 12A, 12B can have an electrical conductivity in a range of 1 S/m to 150 S/m, in a range of 10 S/m to 100 S/m, in a range of 10 S/m to 50 S/m, or in a range of 10 S/m to 30 S/m (e.g., about 20 S/m). The capacitive electrical pathway of the interface structure 10 (modeled as C in FIG. 3C) can have an overall or effective capacitance in a range of 0.1 pF to 100 pF, in a range of 0.5 pF to 20 pF, or in a range of 1 pF to 10 pF.

The dielectric interface features 14A, 14B can comprise any suitable electrically insulating material. For example, in some embodiments, the dielectric interface features 14A, 14B can comprise silicon oxide, silicon nitride, tetraethyl orthosilicate (TEOS), or multilayer structures of silicon oxide and silicon nitride. The effective dielectric constant of the dielectric interface features 14A, 14B can be in a range of 1 to 15, in a range of 1.1 to 9, in a range of 1 to 5 (e.g., silicon oxide), in a range of 1.2 to 9, in a range of 2 to 9, in a range of 3 to 9, in a range of 4 to 6, in a range of 2 to 4, in a range of 7 to 9 (e.g., silicon nitride), or above 9. As explained herein with respect to FIG. 7, multiple layers can be used to define each dielectric interface features 14A, 14B. Further, as explained herein with respect to FIGS. 7-8, in some embodiments, a higher dielectric constant can improve the signal integrity of the device 1. High-K materials with high dielectric constant can be used to increase the capacitance to enhance the equalizer performance.

As with the arrangement of FIGS. 2A-2B, in FIG. 3B a bonding surface 8 of the first conductive interface feature 12A and the first dielectric interface feature 14A can be directly bonded to a corresponding bonding surface 9 of the second conductive interface feature 12B and the second dielectric interface feature 14B, without an intervening adhesive and without the application of pressure or a voltage. As explained above in connection with FIGS. 2A-2C, the bonding surfaces 8, 9 can be polished or planarized, activated, and terminated with a suitable species. The surfaces 8, 9 can be brought into contact to form a direct bond 13 without application of pressure. In some embodiments, the elements 2, 3 can be heated to strengthen the bond 13, for example, a bond between the conductive features. As shown in FIG. 3B, the bond 13 between the two semiconductor elements 2, 3 can extend along a first area $A_{C1}$ between the first and second dielectric features 14A, 14B, along a second area $A_{C2}$ between the first conductive feature 12A and the second dielectric feature 14B, and along a third area $A_R$ between the first and second conductive features 12A, 12B. Beneficially, therefore, the embodiment of FIGS. 3A-3E can directly bond conductors to conductors, non-conductors to non-conductors, and conductors to non-conductors. Moreover, the bond 13 can comprise a covalent bond, which creates a strong mechanical and electrical interconnection between the semiconductor elements 2, 3.

In other embodiments, however, the first conductive feature 12A and the first dielectric feature 14A can be adhered or otherwise bonded to the second conductive feature 12B and the second dielectric feature 14B, e.g., by an adhesive. In such other embodiments, for example, the conductive features 12A, 12B can be adhered by a conductive adhesive, and the dielectric features 14A, 14B can be adhered by an insulating adhesive. The conductive feature 12A can be adhered to the dielectric feature 14B with a conductive or non-conductive adhesive, depending on whether it is desirable to provide a conductive or a non-conductive electrical interface.

Although illustrated separate layers in FIG. 3B, in other embodiments, the dielectric and conductive features 14, 12 can be defined on only one of the contact pads 6A, 6B, and the dielectric and conductive features 14, 12 can be bonded to the other of the contact pads 6A, 6B. In still other embodiments, the first contact pad 6A, the dielectric feature 14, the conductive feature 12, and the second contact pad 6B can be defined on one semiconductor element, and the one semiconductor element can be bonded to the other semiconductor element. Accordingly, the passive components can be defined by layers on both semiconductor elements, and thus created by the direct bonding, or can be formed first on one substrate and direct bonded to another substrate.

The passive equalizer 15 can be defined by a resistive electrical pathway R between the first contact pad 6A and the second contact pad 6B, and by a capacitive electrical pathway $C_1$ between the first contact pad 6A and the second contact pad 6B. For example, as shown in FIG. 3B, the resistive electrical pathway R can be defined through the first contact pad 6A, the first conductive interface feature 12A, the second conductive interface feature 12B, and the second contact pad 6A. As explained above, one or more additional barrier layers may be provided to adjust the equivalent resistance R to a desired range. The resistive pathway R, therefore, may be provided through the conductive bond that is formed between the first and second conductive interface features 12A, 12B (whether the bond is a direct bond or by way of an adhesive).

The capacitive electrical pathway $C_1$ can be defined through the first contact pad 6A, the first and second dielectric interface features 14A, 14B, and the second contact pad 6B. Thus, the capacitive electrical pathway $C_1$ can act as a capacitor in which the first and second contact pads 6A, 6B are the capacitor electrodes, and the intervening dielectric interface feature 14 (a first dielectric gap) is the dielectric. The area $A_{C1}$ of the capacitive pathway C1 can be defined by the illustrated portion of the first and second conductive interface features 12A, 12B that are exposed to the intervening dielectric (see also FIGS. 3D-3E below). As explained below with respect to FIG. 3D, the area $A_{C1}$ can be much larger than the area shown in FIG. 3B, which illustrates only a portion of the area $A_{C1}$ for ease of illustration.

Figure 3D:
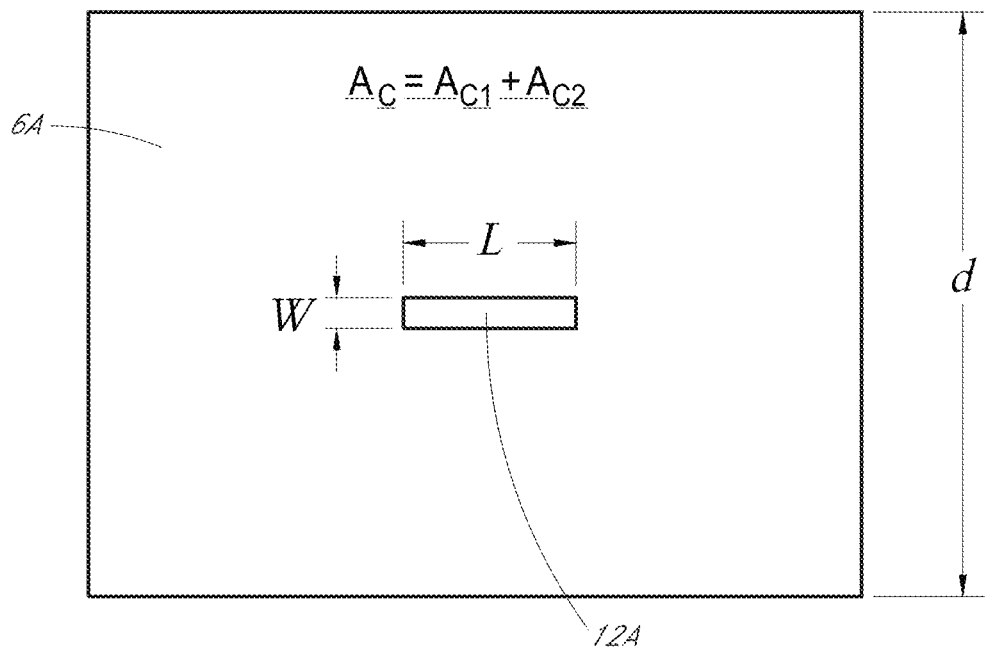
FIG. 3D is a schematic plan view of the first contact pad with a first conductive interface feature coupled with the first contact pad.
Figure 3E:
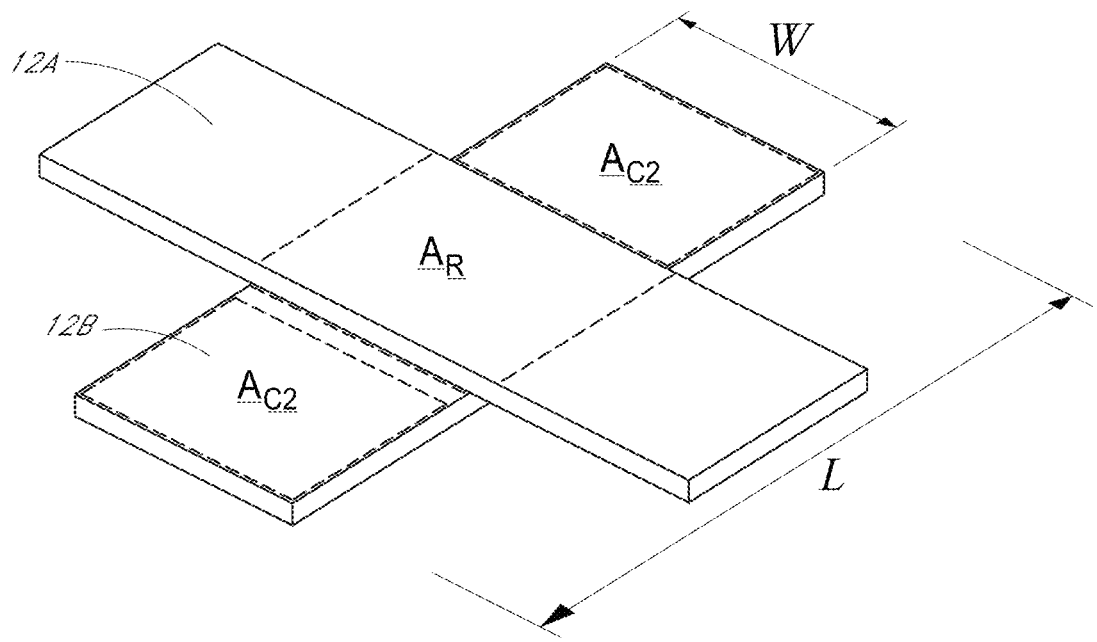
FIG. 3E is a schematic perspective view of the connection between the first conductive interface feature and a second conductive interface feature that is coupled with the second contact pad.

In addition, in various embodiments, a second capacitive electrical pathway $C_2$ can be defined between the first contact pad 6A and the second contact pad 6B. As explained below, in some embodiments, the conductive pathways 12A, 12B can be disposed crosswise relative to one another, such that some dielectric material intervenes between a contact pad 6 (e.g., one of the contact pads 6A or 6B) and an opposing conductive interface feature 12 (e.g., the other of the interface feature 12A or 12B). The second capacitive electrical pathway $C_2$ illustrated in FIG. 3B can act as a capacitor in which the first conductive interface feature 12A and the second contact pad 6B are the capacitor electrodes, and the intervening nonconductive dielectric interface feature 14B (a second dielectric gap) is the dielectric. As explained below, the area $A_{C2}$ of the second capacitive pathway $C_2$ can be defined by the illustrated portions of the second contact pad 6B and the first conductive interface feature 12A (and/or by portions of the first contact pad 6B and portions of the second conductive interface feature 12B). In FIG. 3B, the area $A_{C2}$ appears to be larger than $A_{C1}$, however, as shown in FIGS. 3D-3E, the area $A_{C2}$ can be significantly smaller than $A_{C1}$ across the contact pads 6, since only a portion of the contact pads 6 are shown in the cross-section of FIG. 3B. Although the dielectric gap in $A_{C1}$ may be larger than that in $A_{C2}$, the area $A_{C1}$ can contribute significantly to overall capacitance due to the larger area in this region in various embodiments. In the illustrated embodiments, the conductive features 12A, 12B can have a plus-shaped or cross-shaped profile in order to reduce misalignment, as it can be difficult to repeatedly and consistently align the contact pads due to manufacturing process limitations. For situations without misalignment, conductive features 12A and 12B may completely overlap each other. In other words, conductive features 12A and 12B may comprise two dots of circular or square shape and may overlap each other. In such a case, $A_{C2}$ may be very low or approximately zero, but the equivalent resistance can be maximized to enhance the performance of the RC equalizer. For example, for situations with little or no misalignment, conductive features 12A and 12B can overlap each other and can comprise tiny dots (e.g., with diameters on the order of several square micrometers). The contact pads 6A and 6B can be as large as 100 um by 100 um in various embodiments. The contact pads 6A, 6B can be 1,000 to 10,000 times larger than the conductive features 12A and 12B.

FIG. 3D is a schematic plan view of the first contact pad 6A with the first conductive interface feature 12A coupled with the first contact pad 6A. FIG. 3E is a schematic perspective view of the connection between the first conductive interface feature 12A and a second conductive interface feature 12B that is coupled with the second contact pad 6B. For ease of illustration, FIGS. 3D-3E omits the dielectric interface features 14A, 14B, and FIG. 3E omits the contact pads 6A, 6B. As illustrated in FIGS. 3B and 3D-E, the first conductive interface feature 12A can comprise an elongate conductive feature in which a length L of the first conductive interface feature 12A is longer than a width W of the first conductive interface feature 12A. The second conductive interface feature 12B can also comprise an elongate conductive feature, as shown in the cross-section of FIG. 3B.

Advantageously, the elongate interface features 12A, 12B can improve the alignment of the opposing features 12A, 12B and contact pads 6A, 6B during bonding. It should be appreciated that the relatively small size of the features 12A, 12B can make it difficult to align and bond shapes that are compact. Utilizing elongate contact features 12A, 12B can improve the alignment accuracy, as explained throughout U.S. Provisional Patent Application No. 62/269,412, the entire contents of which are hereby incorporated by reference herein in their entirety and for all purposes. As shown and/or described in Application No. 62/269,412, the elongate conductive features or contacts may comprise relatively straight or linear structures, grid structures, rounded structures, etc. At least portions of the elongate conductive features 12A of a first element can be disposed non-parallel or crosswise relative to the corresponding portions of elongate conductive features 12B of a second element, such that at least a portion of the conductive features 12A, 12B overlap to form a resistive connection after bonding. Thus, using elongate conductive interface features 12A, 12B can provide an adequate electrical connection while increasing the misalignment tolerance. Moreover, while only single crossing elongate features are illustrated herein, it will be understood that each contact pad may comprise multiple elongate features (e.g., in a grid or other arrangement) such that the contact area for a single contact defining the resistive path may include multiple overlapping regions of multiple elongate conductive features.

As shown in FIGS. 3D-3E, the overall area of the first conductive interface feature 12A (i.e., L×W for the illustrated feature) can be significantly less than the remaining exposed area $A_C$ of the contact pad 6A. The exposed area $A_C$ of the contact pad 6A can be defined by the total area of the first capacitive region $A_{C1}$ and the second capacitive region $A_{C1}$. Moreover, as shown in FIGS. 3B and 3E, the area $A_R$ can represent the overlapping resistive contact area defined by the interface between the first and second conductive interface features 12A, 12B. Although only a single interface feature 12A is shown in FIG. 3D, it should be appreciated that multiple interface features 12A (or a grid pattern, polygonal shape, etc.) can be defined, such that the area $A_R$ represents the total overlapping resistive contact area for all the interface features 12A associated with the contact pad 6A.

The performance of the passive equalizer 15 can be tuning the values of resistance to capacitance, such as by choice of electrical properties of the barrier layer materials and dielectric materials, and the dimensions that set the resistance and capacitance. In particular, the performance can be tuned by selection of the sizes of the dielectric gaps for the capacitance, and by setting a ratio r between the exposed area $A_C$ of the contact pad 6A and the total overlapping resistive contact area $A_R$, with $A_{C2}$ kept as small as possible. In various embodiments, for example, the ratio r can be in a range of 50:1 to 50,000:1, in a range of 100:1 to 50,000:1, in a range of 150:1 to 50,000:1, in a range of 150:1 to 40,000:1, in a range of 200:1 to 40,000:1, in a range of 500:1 to 40,000:1, in a range of 1,000:1 to 40,000:1, or in a range of 5,000:1 to 40,000:1. In some embodiments, the ratio r can be at least 50:1, at least 100:1, at least 150:1, at least 200:1, at least 500:1, at least 1,000:1, or at least 5,000:1.

In various embodiments, the width W of the conductive interface features 12A, 12B can be in a range of 0.2 microns to 10 microns, in a range of 0.2 microns to 5 microns, in a range of 0.2 microns to 4 microns, in a range of 0.5 microns to 10 microns, in a range of 0.5 micron to 4 microns, or in a range of 0.5 microns to 2 microns. The length L of the conductive interface features 12A, 12B can be in a range of 1 microns to 50 microns, 2 microns to 25 microns, 2 microns to 10 microns, or 4 microns to 8 microns. A total thickness t (see FIG. 3B) of the dielectric interface feature 14 (including the first and second features 14A, 14B) can be in a range of 10 nm to 1 micron, in a range of 10 nm to 500 nm, in a range of 10 nm to 200 nm, in a range of 10 nm to 100 nm, in a range of 10 nm to 60 nm, or in a range of 20 nm to 60 nm.

Figure 4A:
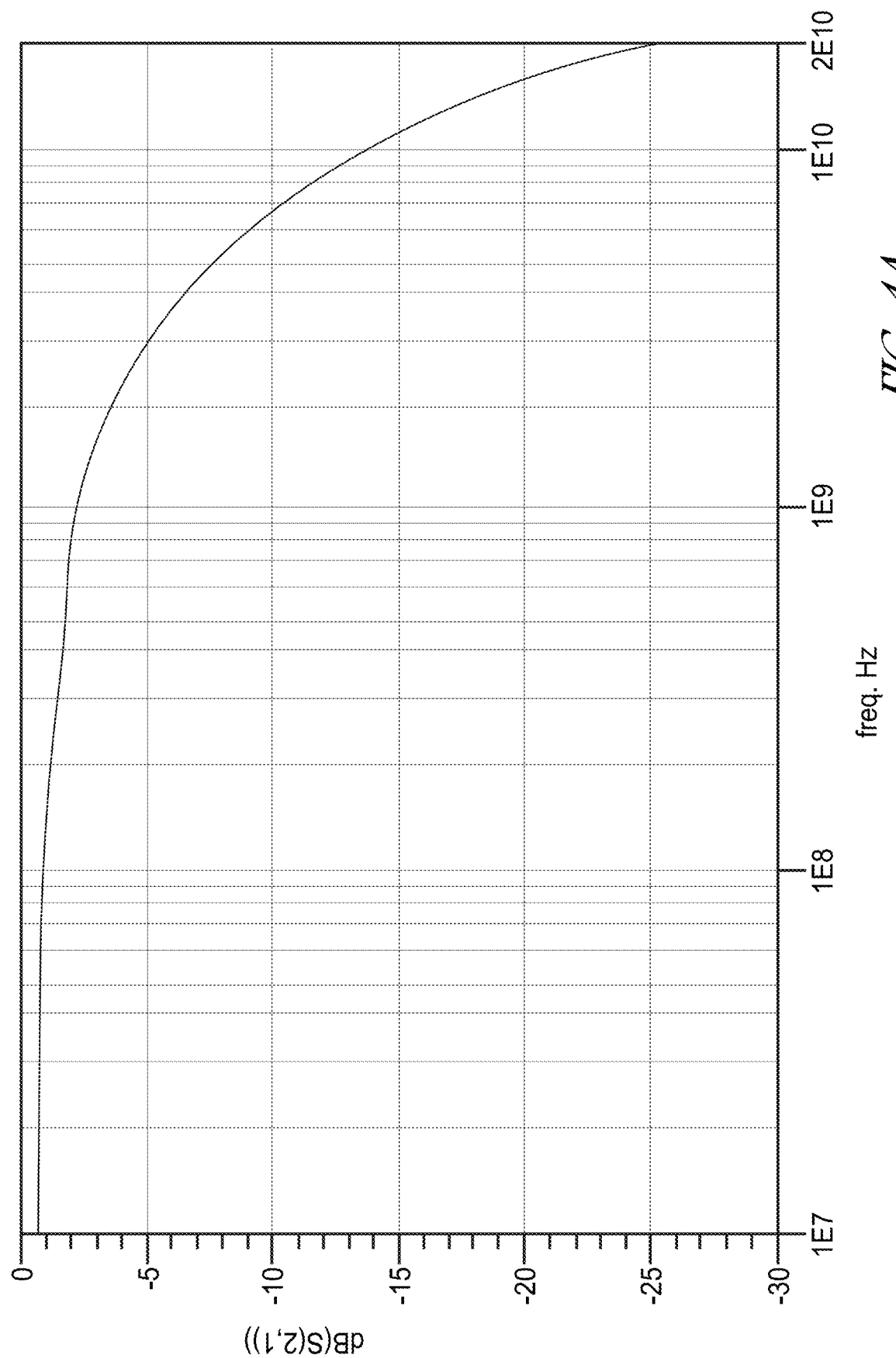
FIG. 4A is a chart illustrating the frequency response of an unequalized channel including the structure associated with the arrangement of FIGS. 2A-2C and a lossy transmission line.
Figure 4B:
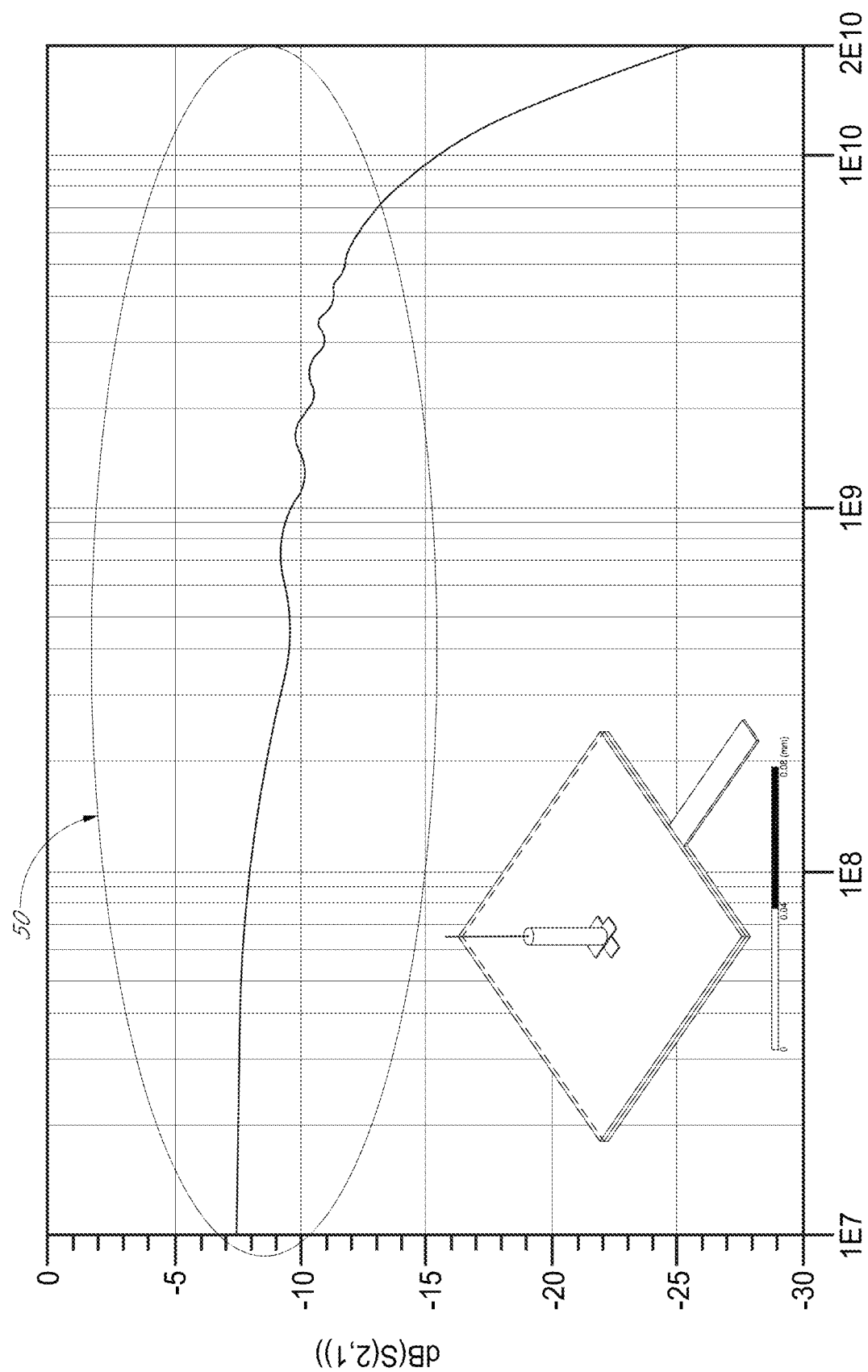
FIG. 4B is a chart illustrating the frequency response of an equalized channel including the equalization device associated with the embodiment of FIGS. 3A-3E and a lossy transmission line that is the same as the lossy transmission line used for FIG. 4A.

FIG. 4A is a chart illustrating the frequency response for a signal through a channel including a lossy transmission line and the contact with the arrangement of FIGS. 2A-2C. FIG. 4B is a chart illustrating the frequency response of a signal through a channel including a lossy transmission line and the contact with the structure of the embodiment of FIGS. 3A-3E. As shown in FIG. 4B, the frequency response (transfer function) plot can beneficially include a flatter frequency response over wider frequency range, in which the transfer function of the signal is flatter over frequency than the signal of FIG. 4A. Indeed, as shown in FIG. 4B, the region 50 can be wider than corresponding regions of FIG. 4A. Thus, the equalization circuit 15 disclosed herein can be configured so as to adjust a frequency response of the interconnected structure 7. As shown in FIG. 4B, the equalizer 15 can be configured to adjust the frequency response of the interconnected structure 7 so as to maintain an amplitude A of a signal within a window of A±5 dB (e.g., between −7 dB and −17 dB, or between −5 dB and −15 dB) at all frequencies less than 10 GHz relative to the signal magnitude at direct current (DC) or 0 Hz point. By contrast, the amplitude of the signal in FIG. 4A varies by more than ±5 dB at all frequencies less than 10 GHz relative to the signal magnitude at DC point. Using the disclosed passive equalizers, the absolute value of the signal magnitude at low frequency can be lower. However, the disclosed passive equalizer can provide smaller variation of the transfer function over frequency, e.g., a flatter frequency response, which results in better signaling performance. Active equalizer provides not only flatter transfer function but also higher absolute value of signal magnitude. However, active equalizers consume power and may be more complex and expensive than passive equalizers. Thus, the passive equalizer 15 shown in FIGS. 3A-3E can yield a frequency response that is less lossy than the frequency response of the structure shown in FIGS. 2A-2C, and which maintains the integrity of the signal over a broader range of frequencies.

Figure 4C:
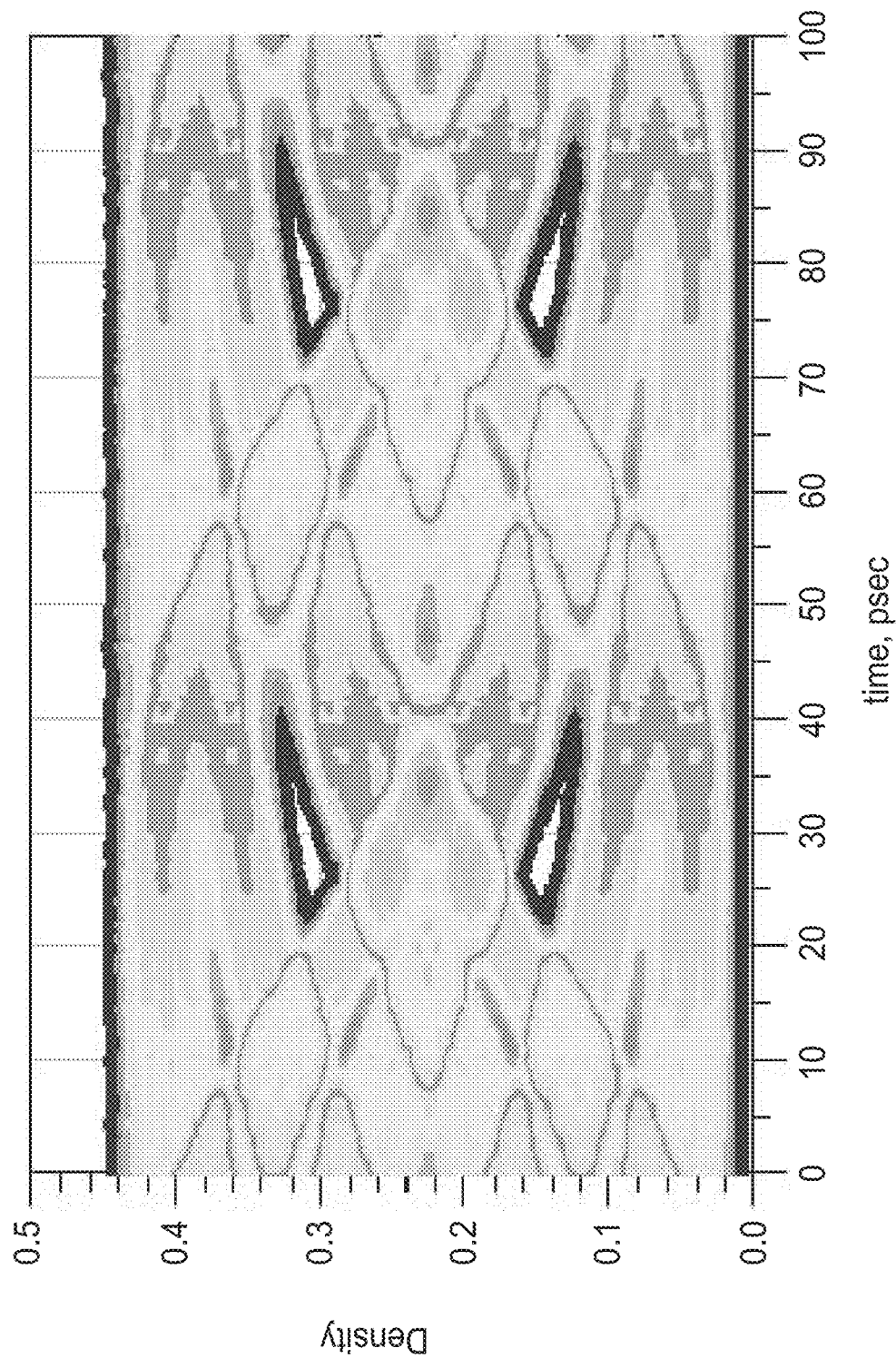
FIG. 4C is a computer simulation result of the eye diagram for the signaling along an unequalized channel including the structure shown in FIGS. 2A-2C and a lossy transmission line.
Figure 4D:
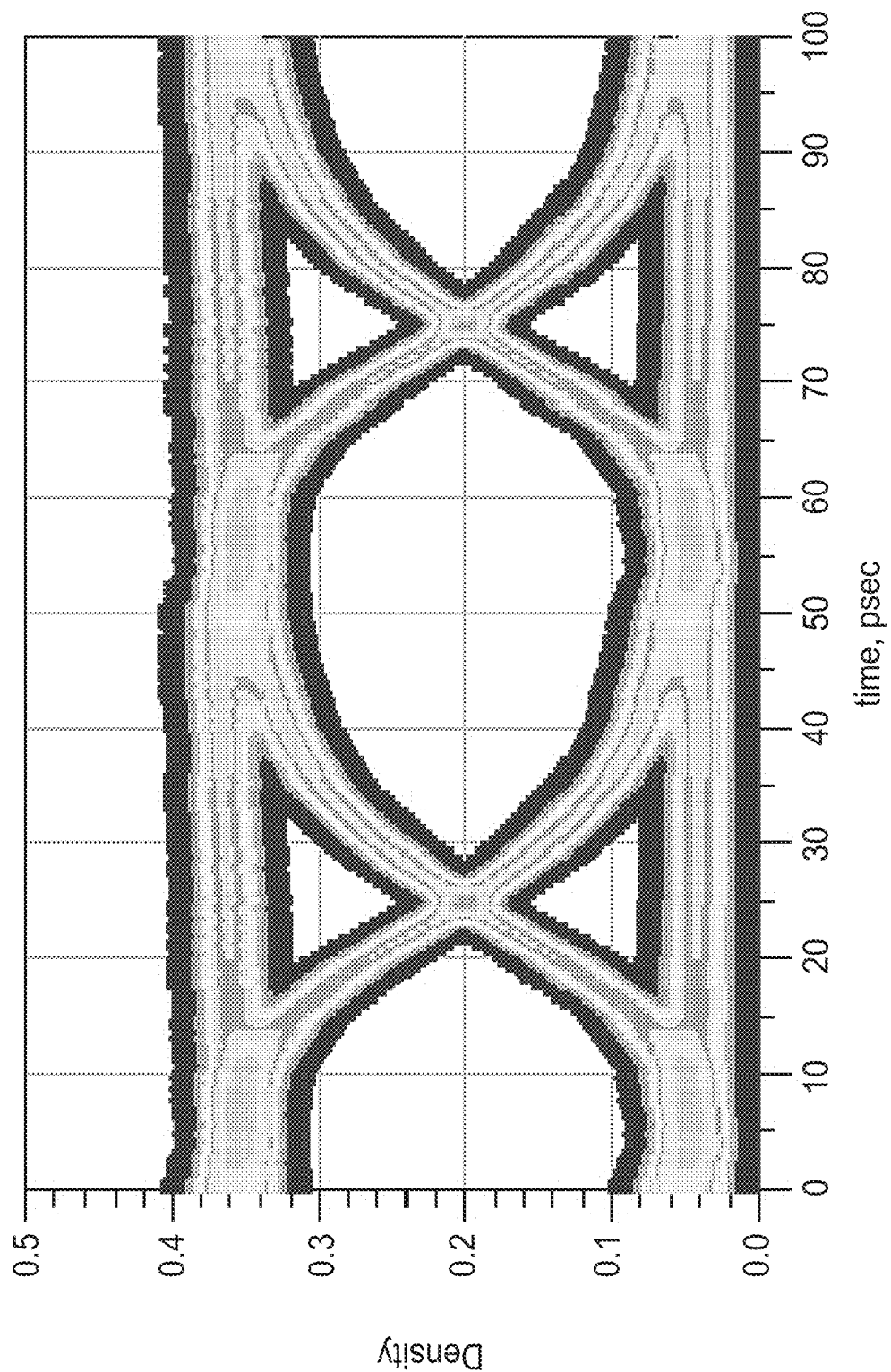
FIG. 4D is a computer simulation result of the eye diagram for the signaling along an equalized channel including the device shown in FIGS. 3A-3E and lossy transmission line that is same as the lossy transmission line used for FIG. 4C.

FIG. 4C is a computer simulation result of the eye diagram for the signaling along a channel that includes a lossy transmission line and the structure of the device shown in FIGS. 2A-2C. FIG. 4D is a computer simulation result of the eye diagram for the signaling along a channel that includes a lossy transmission line and the interconnect structure of the device shown in FIGS. 3A-3E. The simulation was carried out by cascading a lossy channel with the interconnects shown in FIGS. 2A-2C and 3A-3E, respectively. The simulated data rate was 20 Gbps with a rise time of 20 ps and utilizing a trapezoidal waveform. As shown in FIG. 4D, the passive equalizer 15 of the embodiment of FIGS. 3A-3E yields a signal integrity that is significantly better than the signal of the structure shown in FIGS. 2A-2C.

Figure 5:
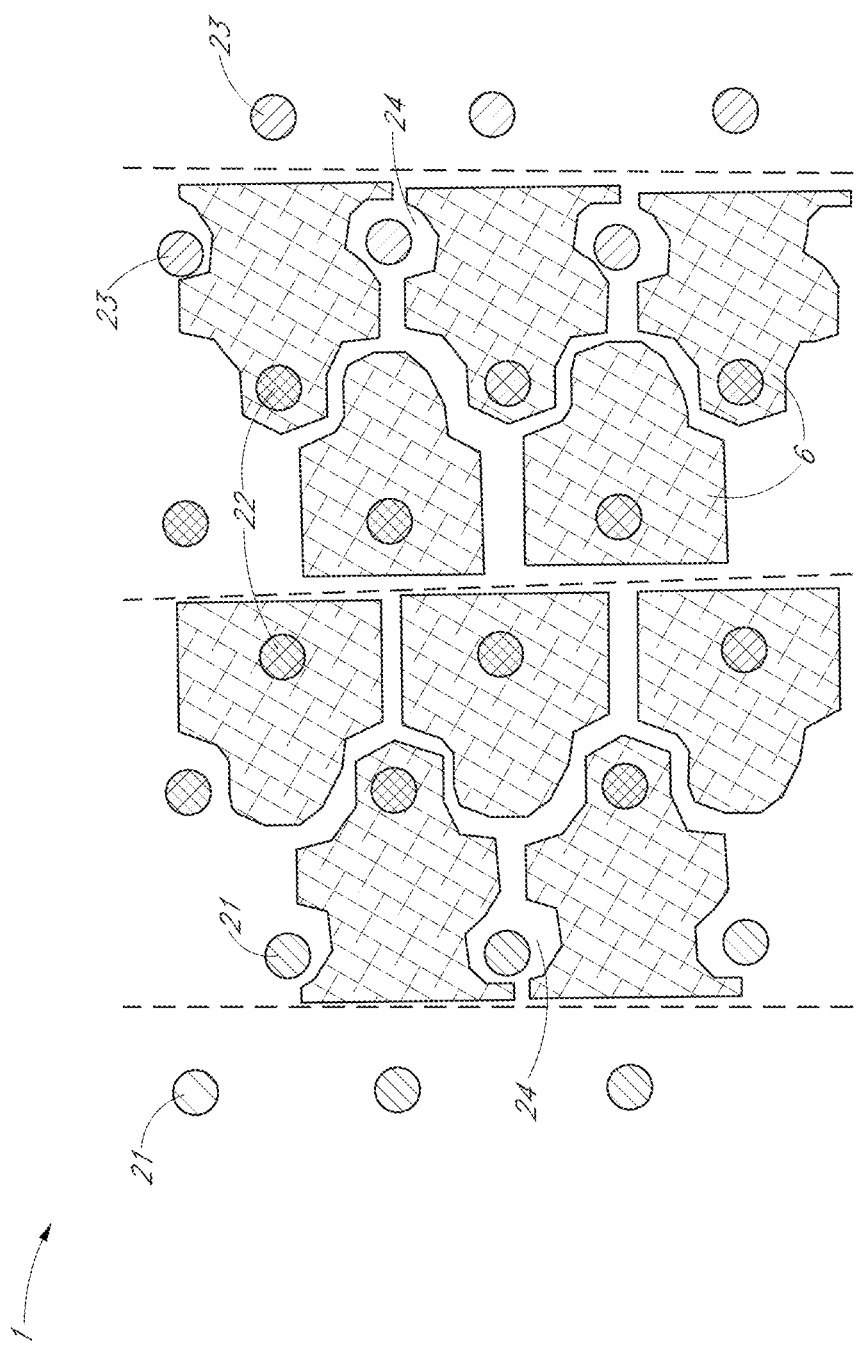
FIG. 5 is a plan view of a portion of a device that shows one arrangement of contact pads associated with a semiconductor element, according to some embodiments.

FIG. 5 is a plan view of a portion of a device 1 that shows one arrangement of contact pads 6 associated with a semiconductor element. The contact pads 6 shown in FIG. 5 can be associated with any type of semiconductor element (or other type of element), such as a device die (such as a communications die, a memory die, or a processor die) or an interposer. Each contact pad 6 can be associated with a signal pin 22 that routes an electrical signal to the associated pad 6. In addition, one or more ground pins 21 and one or more power pins 23 can be provided in gaps 24 between adjacent contact pads 6. Advantageously, the area of the contact pads 6 can be increased, and accordingly the associated capacitance can be increased, by defining the contact pads 6 in irregular or serpentine shapes and by reducing the profile of the ground and power pins 21, 23. The irregular shapes of the contact pads 6 can enable the smaller ground and power pins 21, 23 to be disposed in small gaps 24 between the pads 6, which allows for an increased area of the contact pads 6 and increased capacitance for tuning the RC circuit formed by the interface structure. The resulting increase in capacitance can improve signal integrity, as explained herein.

Figure 6A:
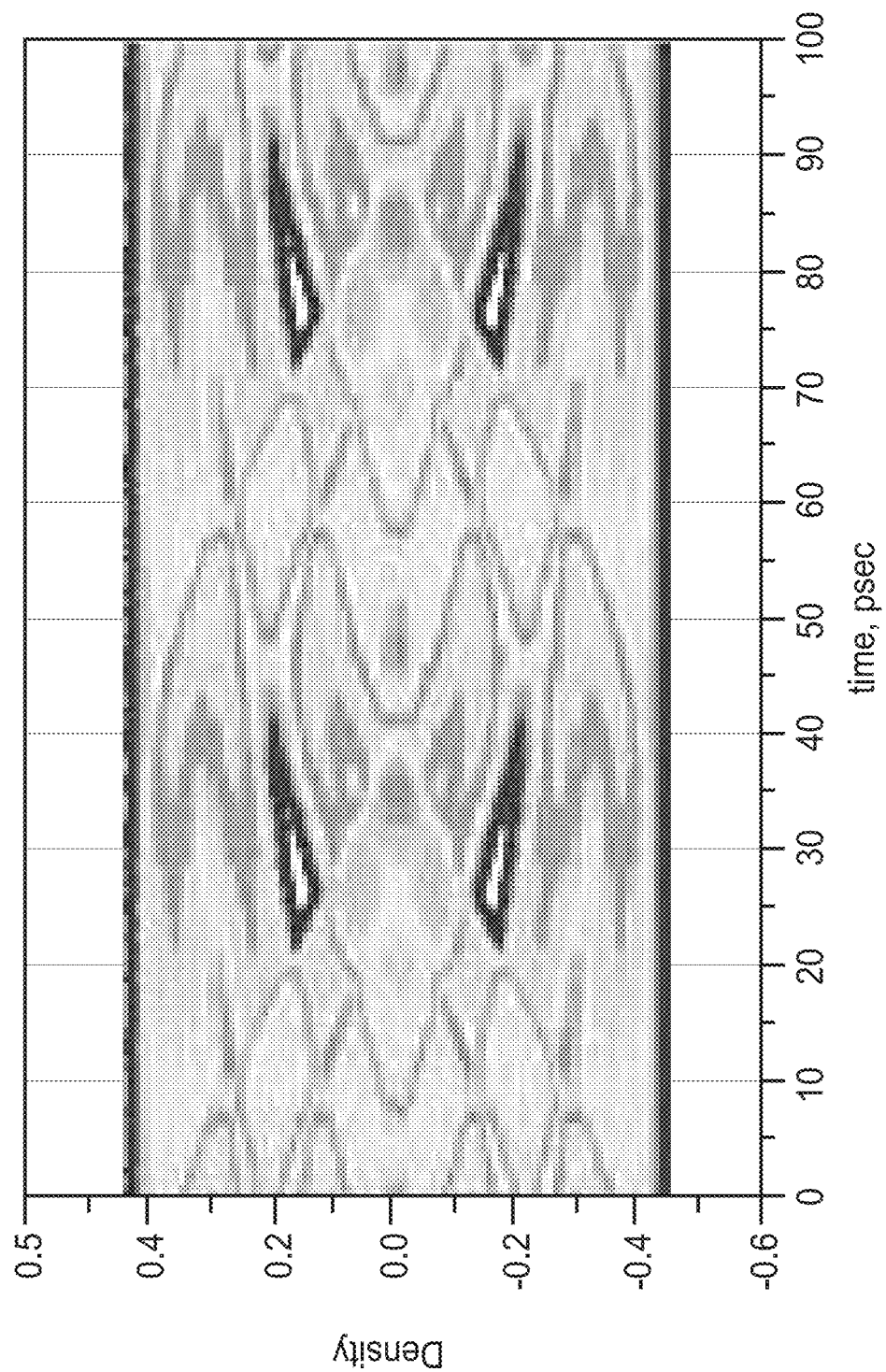
FIGS. 6A-6D illustrate plots of eye diagrams for various stacked and electrically interconnected structures contact pads of different areas.
Figure 6B:
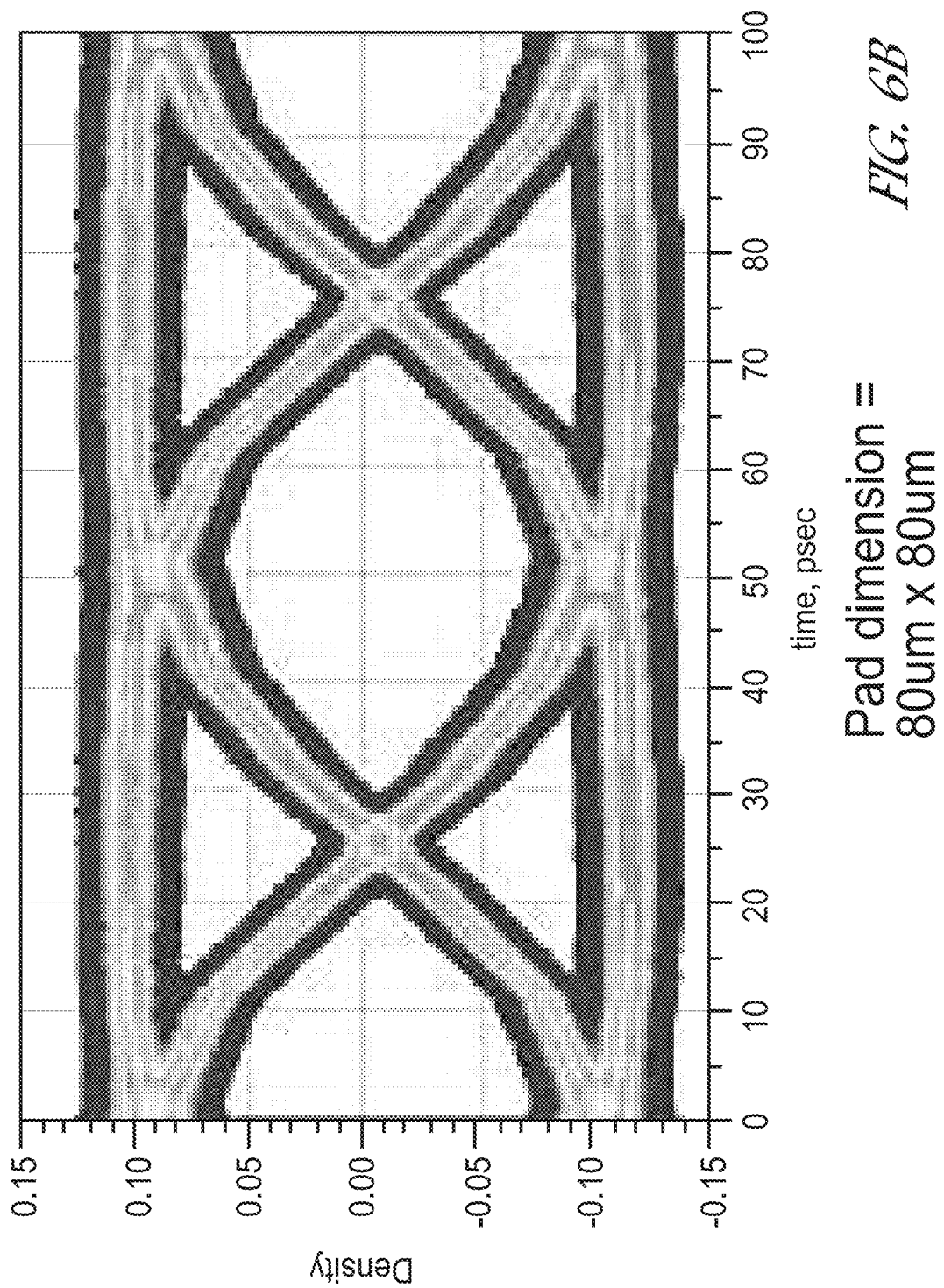
Figure 6C:
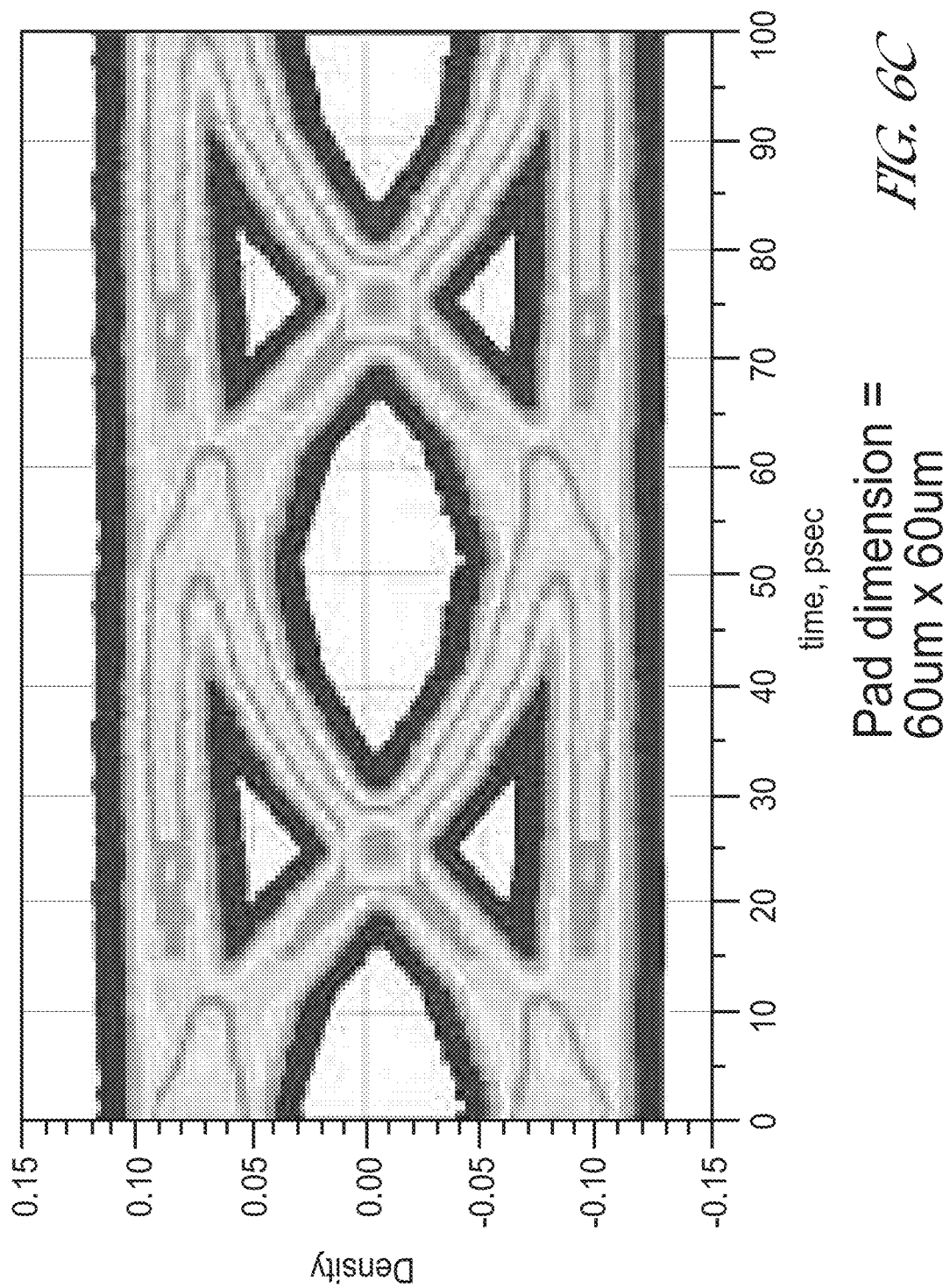
Figure 6D:
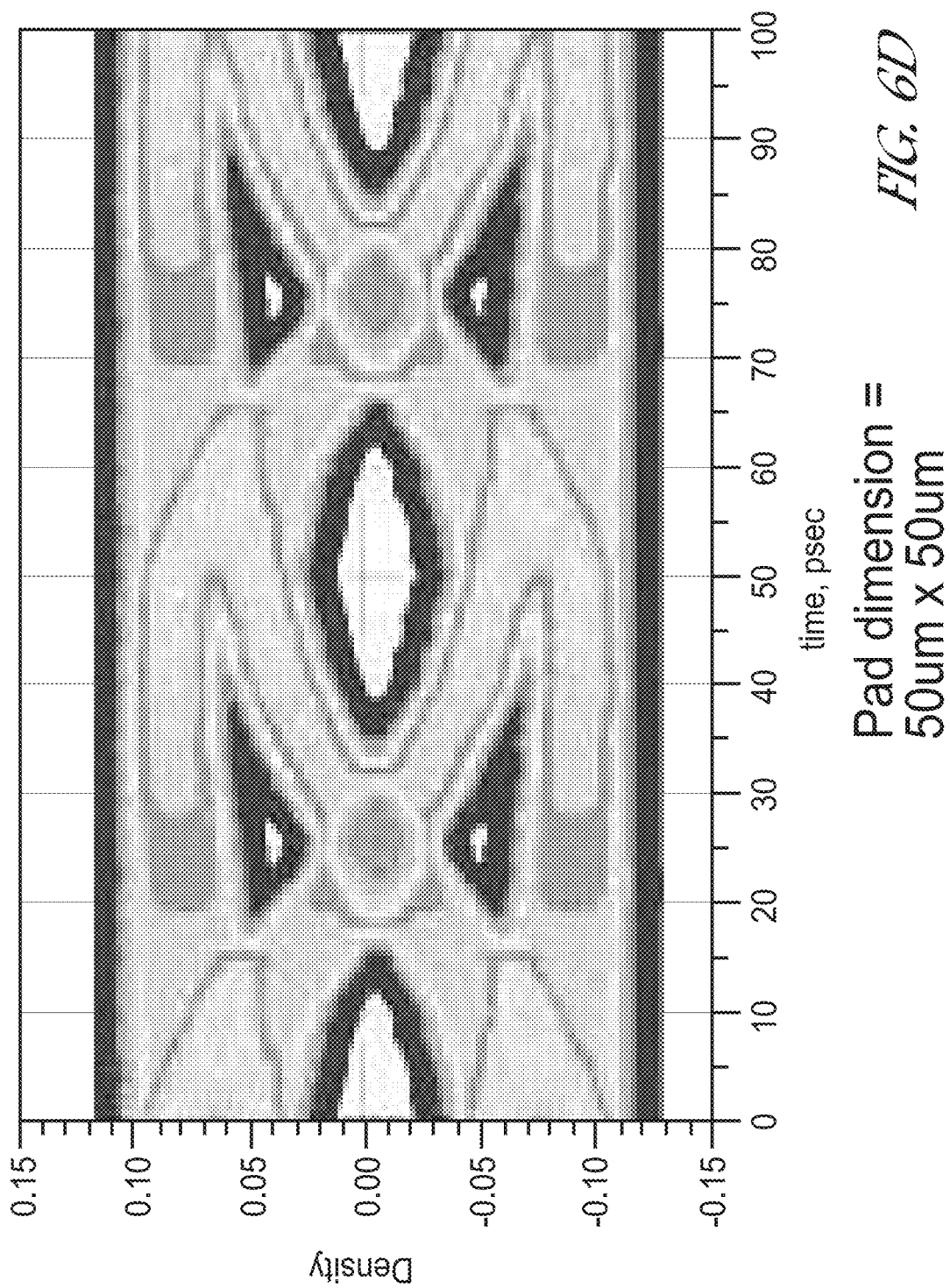

FIG. 6A illustrates a plot of eye diagram for the signaling over an structure without a passive equalizer, similar to the arrangement of FIGS. 2A-2C. Plots of current density over time are also shown for an interconnected structure with a passive equalizer 15 similar to the embodiments of FIGS. 3A-3E and 5, and with a contact pad 6 dimension of 80 microns×80 microns (FIG. 6B), 60 microns×60 microns (FIG. 6C), and 50 microns×50 microns (FIG. 6D). As shown in FIGS. 6A-6D, the signal illustrated in FIG. 6B has the best signal quality, which is associated with the largest contact pad 6. As explained herein, in general, larger contact pads 6 may result in higher capacitance and improved signal integrity as compared with smaller contact pads 6, or as compared with systems lacking a passive equalizer.

Figure 7:
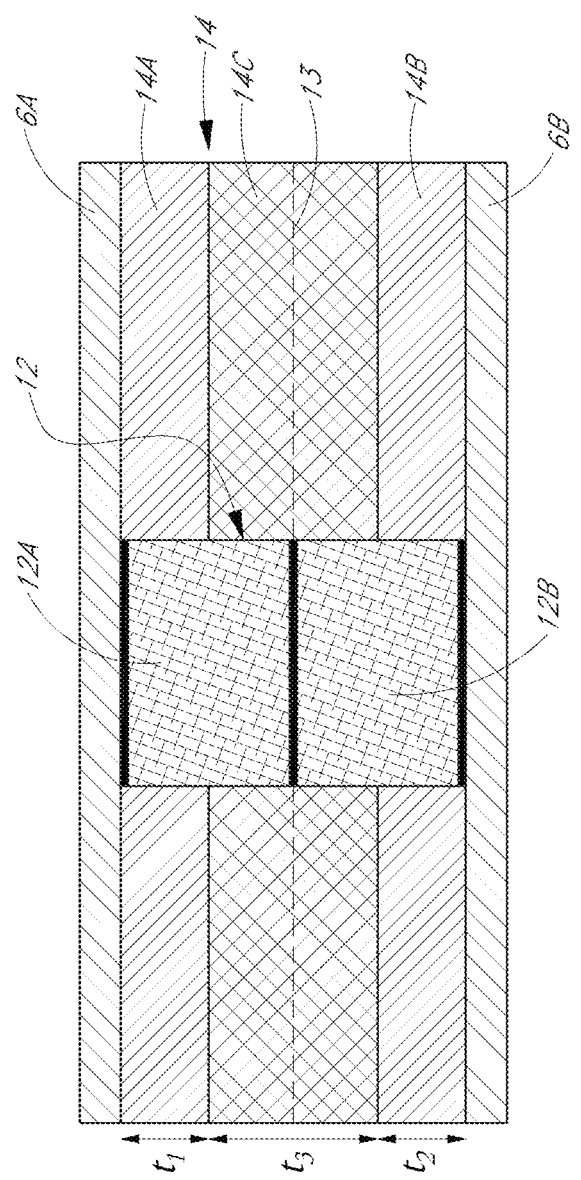
FIG. 7 is a side cross-sectional view of a portion of an stacked and electrically interconnected structure, in accordance with various embodiments.

FIG. 7 is a side cross-sectional view of a portion of a stacked and electrically interconnected structure 7, in accordance with various embodiments. Unless otherwise noted, reference numerals for the components of FIG. 7 represent components that are the same as or similar to like-numbered components in FIGS. 1A-3E. Unlike the arrangements of FIGS. 1A-3E, the dielectric interface feature 14 can comprise a plurality of layers. For example, the dielectric interface feature 14 can include the first feature 14A coupled with the first pad 6A and the second feature 14B coupled with the second pad 6B. In addition, a third dielectric interface feature 14C can be coupled with or deposited on the first dielectric interface feature 14A. A fourth dielectric interface feature 14D can be coupled with or deposited on the second dielectric interface feature 14B.

In various embodiments, materials and relative thicknesses $t_1$ and $t_2$ of the respective first and second features 14A, 14B and a total thickness $t_3$ of the intervening third and fourth features 14C, 14D can be selected so as to provide a desired effective capacitance. In some embodiments, the thickness $t_3$ can be greater than each of the thicknesses $t_1$ or $t_2$, e.g., at least twice the thickness $t_1$ or $t_2$. Moreover, the materials of the respective dielectric features 14A-14D can also be selected so as to provide the desired effective capacitance. For example, the features 14A-14D can comprise silicon oxide, silicon nitride, TEOS, or any other suitable dielectric material. In some embodiments, for example, the first and second dielectric interface features 14A, 14B can comprise silicon oxide, and the third and fourth dielectric interface features 14C, 14D can comprise silicon nitride.

Figure 8B:
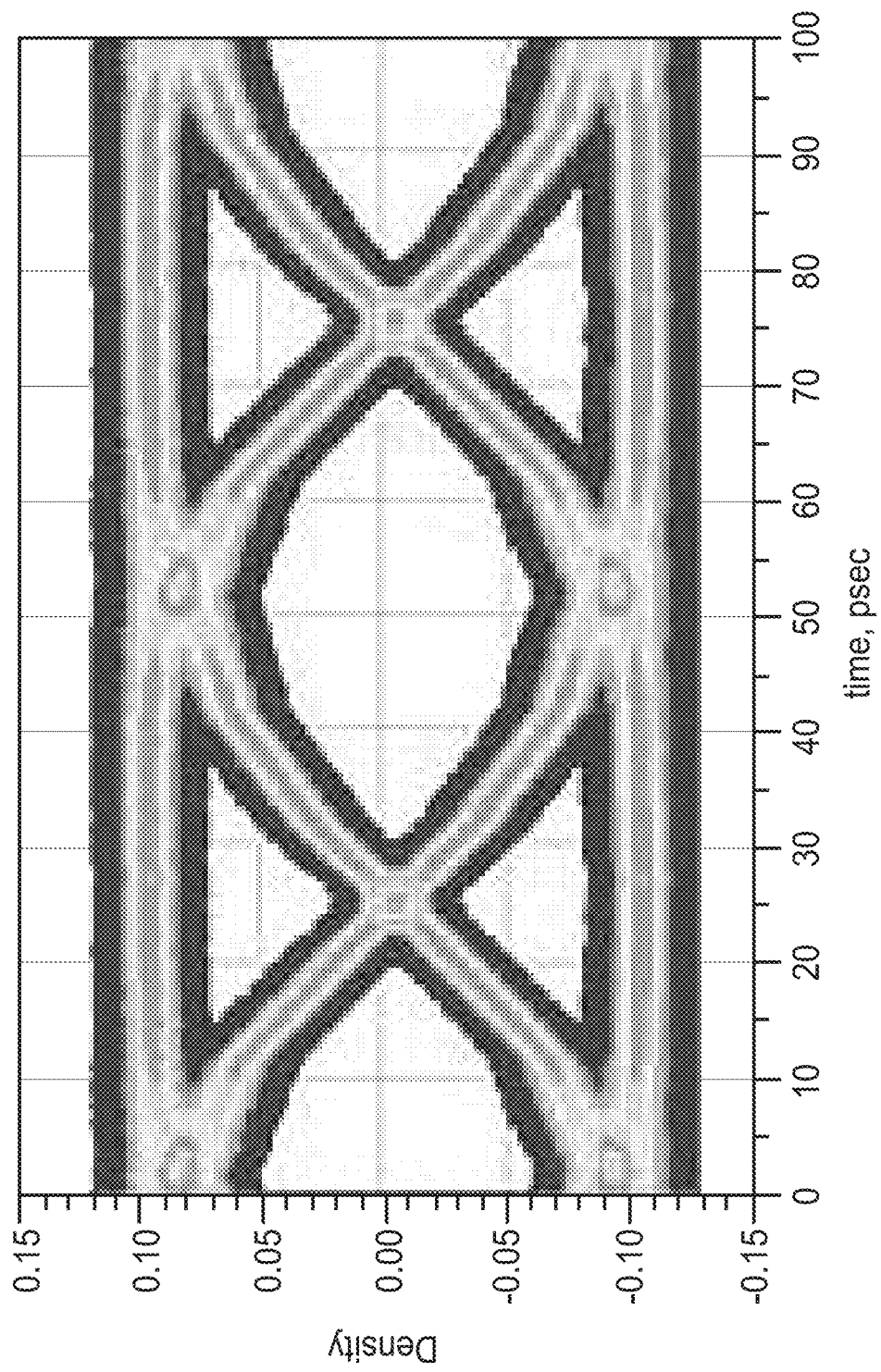
Figure 8C:
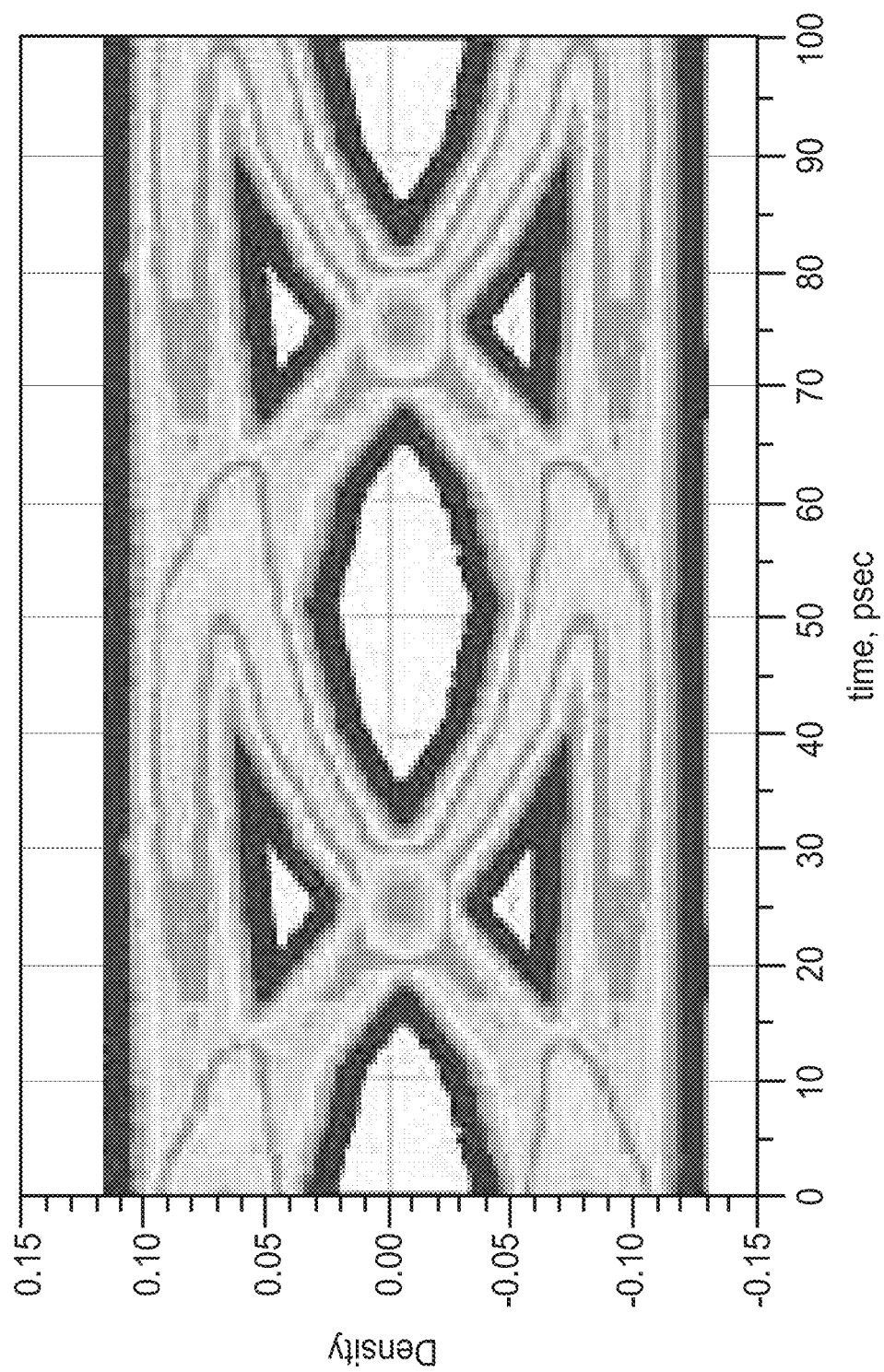
Figure 8D:
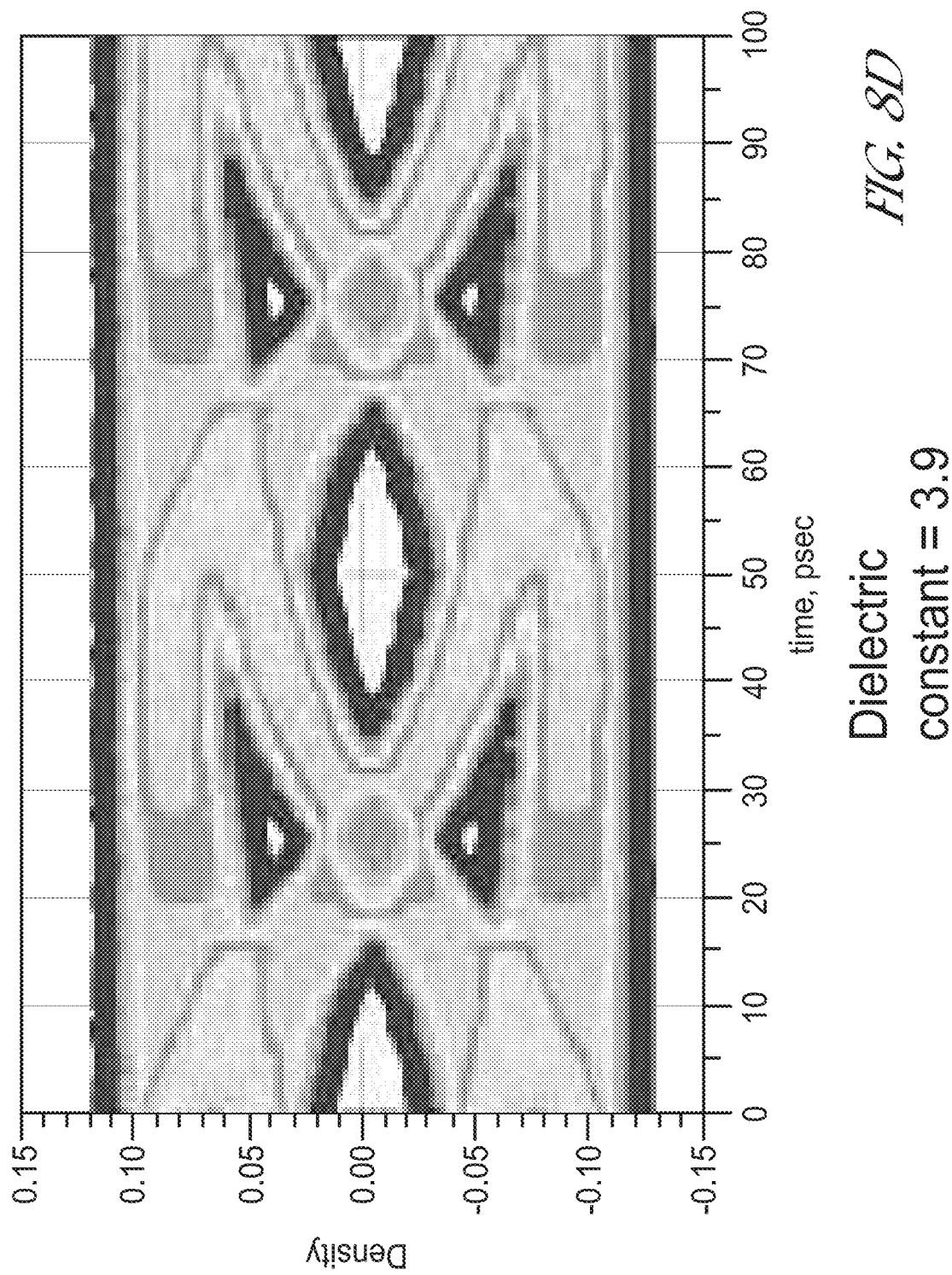

FIG. 8A illustrates a plot of the eye diagram for the signaling over a stacked structure without a passive equalizer, similar to the arrangement of FIGS. 2A-2C. Plots of current density over time are also shown for a stacked structure with a passive equalizer 15 similar to the embodiments of FIGS. 3A-3E and 5, and with an effective dielectric constant of 8 (FIG. 8B); an effective dielectric constant of 5 (FIG. 8C); and an effective dielectric constant of 3.9 (FIG. 8D). As shown in FIG. 8B, increasing the effective dielectric constant can beneficially improve the signal integrity of lossy channels.

Figure 9:
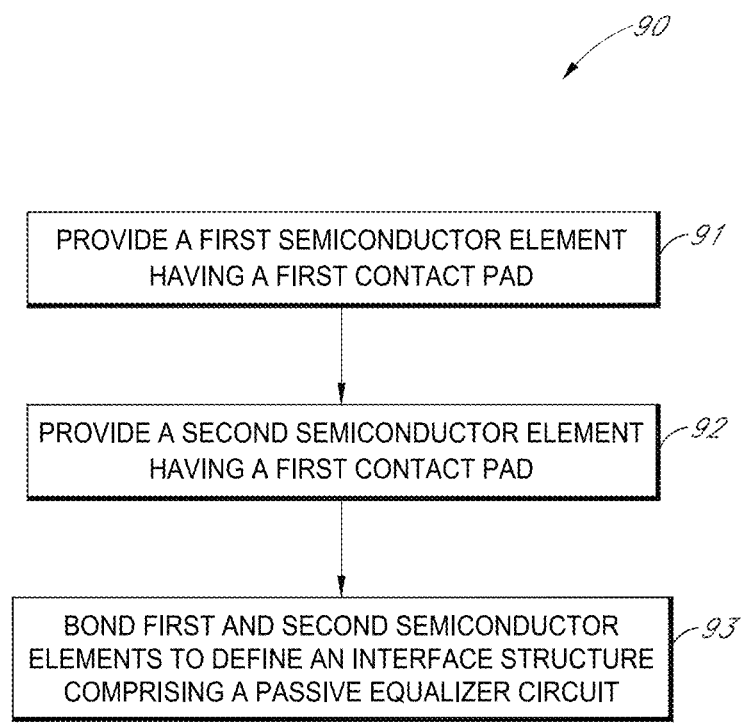
FIG. 9 is a flowchart illustrating a method for forming an stacked and electrically interconnected structure, according to various embodiments.

FIG. 9 is a flowchart illustrating a method 90 for forming a stacked structure. The method 90 begins in a block 91, in which a first semiconductor element comprising a first contact pad is provided. As explained above, although the embodiment of FIG. 9 is described in connection with a semiconductor element, it should be appreciated that other types of elements (e.g., optical elements, electronic elements or other elements that may or may not comprise a semiconductor material) may be used in conjunction with the disclosed embodiments. As explained herein, the first semiconductor element can comprise any suitable semiconductor element, such as an integrated device die, an interposer, etc. In some embodiments, for example, the first semiconductor element can comprise a memory die or a processor die. The first contact pad can have a major dimension in a range of 5 microns to 150 microns, in a range of 10 microns to 150 microns, in a range of 25 microns to 150 microns, in a range of 25 microns to 120 microns, in a range of 30 microns to 120 microns, in a range of 30 microns to 100 microns, in a range of 40 microns to 100 microns, in a range of 50 microns to 100 microns, in a range of 50 microns to 90 microns, or in a range of 50 microns to 80 microns. The contact pads can be polygonal (e.g., rectangular or square), rounded (e.g., circular, elliptical, etc.), or any other suitable shape. The contact pads can include a planar plate on which protruding portions are formed or attached. Dielectric overlayers can cover the non-protruding portions of the underlying planar plate. The protruding portions can be or include segments that are elongate in dimensions parallel to the planar plate. The protruding portions protrude relative to the planar plate, but may be recessed, protruding or flush with the planar dielectric overlayers.

In a block 92, a second semiconductor element comprising a second contact pad can be provided. As with the first semiconductor element, the second semiconductor element can comprise any suitable semiconductor element (or other type of element), such as an integrated device die, an interposer, etc. In some embodiments, for example, the second semiconductor element can comprise a communications die, a memory die or a processor die. The second contact pad can have a major dimension in a range of 5 microns to 150 microns, in a range of 10 microns to 150 microns, in a range of 25 microns to 150 microns, in a range of 25 microns to 120 microns, in a range of 30 microns to 120 microns, in a range of 30 microns to 100 microns, in a range of 40 microns to 100 microns, in a range of 50 microns to 100 microns, in a range of 50 microns to 90 microns, or in a range of 50 microns to 80 microns. The contact pads can include a planar plate on which protruding portions are deposited or formed and on which dielectric overlayers cover the non-protruding portions of the underlying planar plate. The protruding portions can be or include segments that are elongate in dimensions parallel to the planar plate. The protruding portions protrude relative to the planar plate, but may be recessed, protruding or flush with the planar dielectric overlayers.

Moving to a block 93, the first semiconductor element can be bonded to the second semiconductor element to define an interface structure comprising a passive equalization circuit. The passive equalization circuit can include a resistive electrical pathway between the first contact pad and the second contact pad and a capacitive electrical pathway between the first contact pad and the second contact pad. The resistive electrical pathway can comprise a conductive interface feature between the first contact pad and the second contact pad, and the capacitive electrical pathway can comprise a dielectric interface feature between the first contact pad and the second contact pad. For example, the resistive pathway can be defined by the overlapping and directly contacting portions of crossing elongate segments of the protruding portions of both contact pads. The capacitive electrical pathway can be defined by dielectric gaps between non-contacting portions of the contact pads, including non-overlapping portions of the protruding portions, with a first dielectric gap, and overlapping portions of the underlying planar plates with a second dielectric gap that is larger than the first dielectric gap by the heights of the protrusions. In some embodiments, the first and second semiconductor elements can be directly bonded to one another without an intervening adhesive and without application of pressure or a voltage.

Figure 10B:
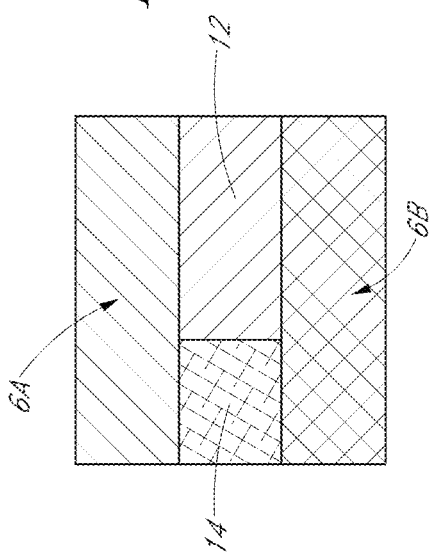
FIG. 10B is a schematic side sectional view of the interface structure shown in FIG. 10A.
Figure 10C:
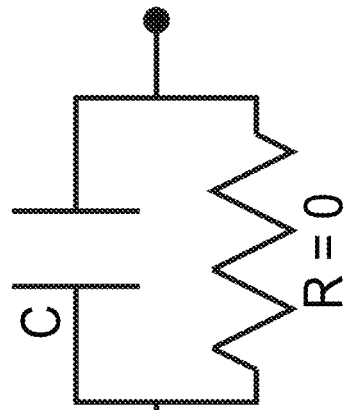
FIG. 10C is a schematic diagram of an electrical model of the interface structure of FIGS. 10A-10B.
Figure 10A:
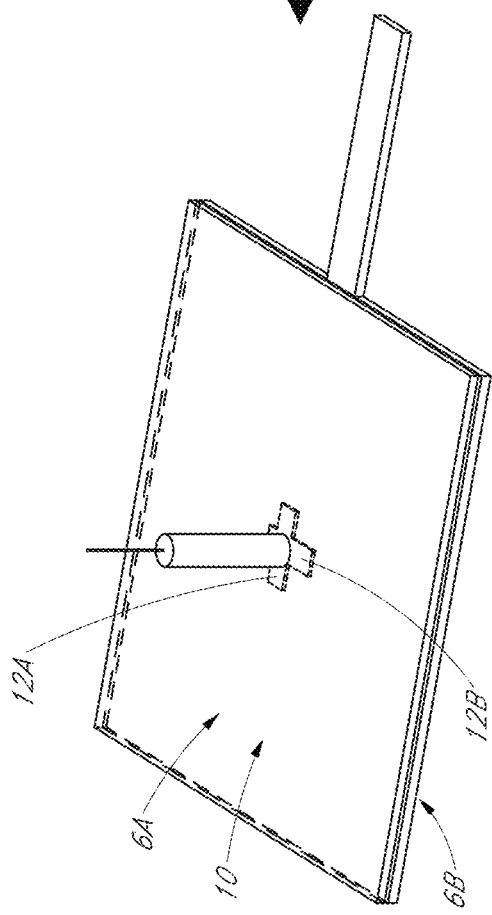
FIG. 10A is a schematic perspective view of a portion of a stacked structure having an interface structure that electrically and mechanically connects two semiconductor elements, with the remainder of the semiconductor elements omitted (including other contact pads that may be similarly configured) for ease of illustration.

FIG. 10A is a schematic perspective view of a portion of a stacked structure 7 having an interface structure 10 that electrically and mechanically connects two semiconductor elements (or other types of elements), with the remainder of the semiconductor elements omitted (including other contact pads that may be similarly configured) for ease of illustration. FIG. 10B is a schematic side sectional view of the interface structure 10 shown in FIG. 10A. FIG. 10C is a schematic diagram of an electrical model of the interface structure 10 of FIGS. 10A-10B. As with the embodiments of FIGS. 2A-9, in FIGS. 10A-10C, one or more passive electronic components can be defined between the two bonded semiconductor elements. In the arrangement of FIGS. 10A-10C, for example, a passive electronic component comprising a resistor R with no or negligible resistance can be provided in parallel with a capacitor C. As shown in FIG. 10B, the passive electronic component can be defined by a conductive interface feature 12 disposed adjacent to (and/or surrounded by) a dielectric interface feature 14. In the illustrated embodiment, the conductive interface feature 12 can have negligible resistance, e.g., may comprise copper without resistive barrier layers, such as the barrier layers described in connection with FIGS. 3A-3E. The resistive pathway R (which may have negligible resistance) can be defined by the first contact pad 6A, the conductive feature 12, and the second contact pad 6B. The capacitive pathway C can be defined by the first contact pad 6A, the dielectric feature 14, and the second contact pad 6B.

Although illustrated as a continuous layer in FIG. 10B, as explained herein, a portion of the dielectric and conductive features 14, 12 can be defined on the first pad 6A, and the remaining portion of the dielectric and conductive features 14, 12 can be defined on the second pad 6B, such that, when the devices are bonded together, the passive component can be defined between the two semiconductor elements. In other embodiments, however, the dielectric and conductive features 14, 12 can be defined on only one of the contact pads 6A, 6B, and the dielectric and conductive features 14, 12 can be bonded to the other of the contact pads 6A, 6B. In still other embodiments, the first contact pad 6A, the dielectric feature 14, the conductive feature 12, and the second contact pad 6B can be defined on one semiconductor element, and the one semiconductor element can be bonded to the other semiconductor element. In other words, the passive electronic components can be defined by layers formed on one of the semiconductor elements, or by a combination of layers on both of the semiconductor elements being directly bonded.

FIG. 11A is a schematic perspective view of a portion of a stacked structure 7 having an interface structure 10 that electrically and mechanically connects two semiconductor elements, with the remainder of the semiconductor elements omitted (including other contact pads that may be similarly configured) for ease of illustration. FIG. 11B is a schematic side sectional view of the interface structure 10 shown in FIG. 11A. FIG. 11C is a schematic diagram of an electrical model of the interface structure 10 of FIGS. 11A-11B. The interface structure 10 of FIGS. 11A-11C can define a passive electronic component between the bonded semiconductor elements. In the illustrated embodiment, for example, the interface structure 10 can comprise a capacitor C having a dielectric interface feature 14 between the contact pads 6A, 6B, such that the capacitive pathway C can be defined by the first contact pad 6A, the dielectric interface feature 14, and the second contact pad 6B.

Although illustrated as a continuous layer in FIG. 11B, as explained herein, a portion of the dielectric feature 14 can be defined on the first pad 6A, and the remaining portion of the dielectric feature 14 can be defined on the second pad 6B, such that, when the devices are bonded together, the passive component can be defined between the two semiconductor elements. In other embodiments, however, the dielectric feature 14 can be defined on only one of the contact pads 6A, 6B, and the dielectric features 14 can be bonded to the other of the contact pads 6A, 6B. In still other embodiments, the first contact pad 6A, the dielectric feature 14, and the second contact pad 6B can be defined on one semiconductor element, and the one semiconductor element can be bonded to the other semiconductor element. In other words, the passive electronic components can be defined by layers formed on one of the semiconductor elements, or by a combination of layers on both of the semiconductor elements being directly bonded.

In one embodiment, a stacked and electrically interconnected structure is disclosed. The structure can include a first element comprising a first contact pad, and a second element comprising a second contact pad. The first contact pad and the second contact pad can be electrically and mechanically connected to one another by an interface structure. The interface structure can comprise a passive equalization circuit that includes a resistive electrical pathway between the first contact pad and the second contact pad and a capacitive electrical pathway between the first contact pad and the second contact pad.

In some embodiments, the resistive electrical pathway comprises a conductive interface feature between the first contact pad and the second contact pad, and the capacitive electrical pathway comprises a first dielectric gap between the first contact pad and the second contact pad. The first dielectric gap ca be disposed about the conductive interface feature. The conductive interface feature can comprise an elongate interface feature in which a length of the elongate interface feature is greater than a width of the elongate interface feature. The passive equalizer can comprise a second conductive interface feature between the first contact pad and the second contact pad, the second conductive interface feature comprising a second elongate interface feature disposed in a crossing orientation relative to the first conductive interface feature. In some embodiments, the conductive interface feature is directly bonded to the second conductive interface feature without an intervening adhesive. The capacitive electrical pathway can further comprise a second dielectric gap between the conductive interface feature and the second contact pad. The resistive electrical pathway can define a contact area on at least a portion of the conductive interface feature, and the capacitive electrical pathway can defines a capacitive area between overlapping portions of the first contact pad and the second contact pad, the capacitive area being greater than the contact area. A ratio of the capacitive area to the contact area can be at least 50:1. The ratio can be in a range of 150:1 to 50,000:1. The first dielectric gap can comprise silicon oxide. The first dielectric gap can have a dielectric constant in a range of 2 to 9. The conductive interface feature can comprise a metal nitride barrier material. The first element can comprise an integrated device die and the second element can comprise an interposer. The integrated device die can comprise one or more communications dies, one or more memory dies, or one or more processor dies. A major dimension of the first contact pad can be in a range of 30 microns to 120 microns. The resistive electrical pathway can have an effective resistance in a range of 5 ohm to 70 ohm. The capacitive electrical pathway can have an effective capacitance in a range of 0.2 pF to 50 pF.

In another embodiment, a stacked and electrically interconnected structure is disclosed. The structure can include a first element comprising a first contact pad, and a second element comprising a second contact pad. The structure can include an interface structure electrically and mechanically connecting the first contact pad with the second contact pad. The interface structure can comprise a conductive interface feature between the first contact pad and the second contact pad. A dielectric interface feature can be provided between the first contact pad and the second contact pad.

In some embodiments, a second conductive interface feature can be disposed between the first contact pad and the second contact pad, and the conductive interface feature can be deposited onto the first contact pad and the second conductive interface feature can be deposited onto the second contact pad. The conductive interface feature can be directly bonded to the second conductive interface feature without an intervening adhesive. A second dielectric interface feature can be between the first contact pad and the second contact pad, and the dielectric interface feature can be deposited onto the first contact pad and the second dielectric interface feature is deposited onto the second contact pad. Each of the conductive interface feature and the second conductive interface feature can comprise an elongate interface feature, with the conductive interface feature oriented non-parallel relative to the second conductive interface feature. An overlapping contact region between the conductive interface feature and the second conductive interface feature can define a resistive contact area, and an area of the first contact pad exposed to the dielectric interface feature can define a capacitive area, the capacitive area greater than the resistive contact area. A ratio of the capacitive area to the resistive contact area can be at least 50:1.

In another embodiment, a method for forming a stacked and electrically interconnected structure is disclosed. The method can include providing a first element comprising a first contact pad. The method can include providing a second element comprising a second contact pad. The method can include bonding the first element to the second element to define an interface structure comprising a passive equalization circuit. The passive equalization circuit can include a resistor between the first contact pad and the second contact pad and a parallel capacitor between the first contact pad and the second contact pad.

In some embodiments, bonding comprises directly bonding the first element to the second element without an intervening adhesive. In some embodiments, the capacitor can be defined by the first and second contact pads and an intervening dielectric.

In another embodiment, a stacked and electrically interconnected structure is disclosed. The structure can include a first element comprising a first contact pad, and a second element comprising a second contact pad. The first contact pad and the second contact pad can be electrically and mechanically connected to one another by an interface structure. The interface structure can comprise an equivalent equalization circuit integrated within the interface structure, the equivalent equalization circuit configured to adjust a frequency response of a channel that includes the equivalent equalization circuit and a lossy transmission line.

In some embodiments, the equalization circuit can be configured to adjust the frequency response of the structure so as to maintain an amplitude A of a signal within a window of A±5 dB at all frequencies less than 10 GHz relative to the signal magnitude at direct current (DC). The equalization circuit can comprise a resistor between the first contact pad and the second contact pad and a parallel capacitor between the first contact pad and the second contact pad. The equalization circuit can comprise a series resistor-inductor (RL) passive equalizer or a resistor-inductor-capacitor (RLC) passive equalizer.

In another embodiment, a stacked and electrically interconnected structure is disclosed. The structure can include a first element and a second element directly bonded to the first element along a bonding interface without an intervening adhesive. One or more passive electronic components can be integrally formed between the first and second elements along the bonding interface.

In some embodiments, the one or more passive electronic components can be formed by layers formed on the first element. The one or more passive electronic components can be formed by a combination of layers formed on the first and second elements.

In another embodiment, a structure can comprise an element and at least one passive electronic component. The at least one passive electronic component can be attached or formed by direct bonding. In some embodiments, the structure can comprise a second element. The at least one passive electronic component can be sandwiched between element and the second element without an adhesive layer For purposes of summarizing the disclosed embodiments and the advantages achieved over the prior art, certain objects and advantages have been described herein. Of course, it is to be understood that not necessarily all such objects or advantages may be achieved in accordance with any particular embodiment. Thus, for example, those skilled in the art will recognize that the disclosed implementations may be embodied or carried out in a manner that achieves or optimizes one advantage or group of advantages as taught or suggested herein without necessarily achieving other objects or advantages as may be taught or suggested herein.

All of these embodiments are intended to be within the scope of this disclosure. These and other embodiments will become readily apparent to those skilled in the art from the following detailed description of the embodiments having reference to the attached figures, the claims not being limited to any particular embodiment(s) disclosed. Although this certain embodiments and examples have been disclosed herein, it will be understood by those skilled in the art that the disclosed implementations extend beyond the specifically disclosed embodiments to other alternative embodiments and/or uses and obvious modifications and equivalents thereof. In addition, while several variations have been shown and described in detail, other modifications will be readily apparent to those of skill in the art based upon this disclosure. It is also contemplated that various combinations or sub-combinations of the specific features and aspects of the embodiments may be made and still fall within the scope. It should be understood that various features and aspects of the disclosed embodiments can be combined with, or substituted for, one another in order to form varying modes of the disclosed implementations. Thus, it is intended that the scope of the subject matter herein disclosed should not be limited by the particular disclosed embodiments described above, but should be determined only by a fair reading of the claims that follow.

What is claimed is:

1. A stacked and electrically interconnected structure comprising:
   a first element comprising a first contact pad; and
   a second element comprising a second contact pad, the second element directly bonded to the first element along a bonding interface without an intervening adhesive,
   wherein one or more passive electronic components are integrally formed between a lower surface of the first contact pad and an upper surface of the second contact pad along the bonding interface, the one or more passive electronic components extending across the bonding interface between the first and second elements, wherein the one or more passive electronic components comprises a first electrical pathway in parallel with a second electrical pathway, the first electrical pathway defining a first area between an overlapping portion of a first conductive feature and a second conductive feature, the second pathway defining a second area between overlapping portions of the first contact pad and the second contact pad outside the first area, the second area being greater than the first area.

2. The structure of claim 1, wherein the one or more passive electronic components are formed by layers formed on the first element.

3. The structure of claim 1, wherein the one or more passive electronic components are formed by a combination of layers formed on the first and second elements.

4. The structure of claim 1, wherein the first contact pad has a major dimension in a range of 5 microns to 100 microns.

5. The structure of claim 1, wherein the second contact pad has a major dimension in a range of 50 microns to 150 microns.

6. The structure of claim 1, wherein the one or more passive electronic components comprises a resistive electrical pathway.

7. The structure of claim 6, wherein the resistive electrical pathway has an effective resistance in a range of 5 ohm to 70 ohm.

8. The structure of claim 1, wherein the one or more passive electronic components comprises a capacitive electrical pathway.

9. The structure of claim 8, wherein the capacitive electrical pathway has an effective capacitance in a range of 0.2 pF to 50 pF.

10. The structure of claim 1, wherein the first pathway comprises a resistive electrical pathway, and the second pathway comprises a capacitive electrical pathway.

11. The structure of claim 10, wherein the capacitive electrical pathway comprises a dielectric feature between the first and second contact pads, the resistive electrical pathway at least partially embedded in the dielectric feature.

12. The structure of claim 11, wherein the resistive electrical pathway comprises a conductive interface feature between the first contact pad and the second contact pad.

13. The structure of claim 10, wherein the resistive electrical pathway defines a contact area on at least a portion of the conductive interface feature, and wherein the capacitive electrical pathway defines a capacitive area between overlapping portions of the first contact pad and the second contact pad, the capacitive area being greater than the contact area.

14. The structure of claim 13, wherein a ratio of the capacitive area to the contact area is at least 50:1.

15. The structure of claim 14, wherein the ratio is in a range of 150:1 to 50,000:1.

16. The structure of claim 1, wherein a ratio of the first area to the second area is at least 1:50.

17. The structure of claim 16, wherein the ratio is in a range of 1:150 to 1:50,000.

18. A stacked and electrically interconnected structure comprising:
a first element comprising a first contact pad, the first element having an upper surface and a lower surface opposite the upper surface; and
a second element comprising a second contact pad, the second element having an upper surface and a lower surface opposite the upper surface of the second element, the lower surface of the first element and the upper surface of the second element directly bonded to one another by an interface structure without an intervening adhesive,
the first contact pad and the second contact pad being electrically and mechanically connected to one another by the interface structure, the interface structure disposed along a bonding interface between the first contact pad and the second contact pad, the interface structure comprising a passive equalization circuit that includes a resistive electrical pathway and a capacitive electrical pathway, the capacitive electrical pathway comprising a dielectric feature in the first pad.

19. The structure of claim 18, wherein the resistive electrical pathway at least partially embedded in the dielectric feature.

20. The structure of claim 18, wherein the passive equalization circuit is formed by layers formed on the first element.

21. The structure of claim 18, wherein a surface area of the second contact pad being at least three times larger than a surface area of the first contact pad.

22. The structure of claim 18, wherein the first contact pad has a major dimension in a range of 5 microns to 100 microns.

23. The structure of claim 18, wherein the second contact pad has a major dimension in a range of 50 microns to 150 microns.

24. A stacked and electrically interconnected structure comprising:
a first element comprising a first contact pad, the first element having an upper surface and a lower surface opposite the upper surface; and
a second element comprising a second contact pad, the second element having an upper surface and a lower surface opposite the upper surface of the second element, the lower surface of the first element and the upper surface of the second element directly bonded to one another without an intervening adhesive,
the first contact pad and the second contact pad being electrically and mechanically connected to one another by an interface structure, the interface structure disposed along a bonding interface between the first contact pad and the second contact pad, the interface structure comprising a passive equalization circuit that includes a resistive electrical pathway between the first contact pad and the second contact pad and a capacitive electrical pathway between the first contact pad and the second contact pad, the capacitive electrical pathway comprising a dielectric feature between the first and second contact pads, the resistive electrical pathway at least partially embedded in the dielectric feature.

25. The structure of claim 24, wherein the resistive electrical pathway comprises a conductive interface feature between the first contact pad and the second contact pad, and wherein the dielectric feature of the capacitive electrical pathway comprises a first dielectric gap between the first contact pad and the second contact pad.

26. The structure of claim 25, wherein the conductive interface feature comprises an elongate interface feature in which a length of the elongate interface feature is greater than a width of the elongate interface feature.

27. The structure of claim 26, wherein the passive equalizer comprises a second conductive interface feature between the first contact pad and the second contact pad, the second conductive interface feature comprising a second elongate interface feature disposed in a crossing orientation relative to the first conductive interface feature.

28. The structure of claim 27, wherein the conductive interface feature is directly bonded to the second conductive interface feature without an intervening adhesive.

\* \* \* \* \*